US012625207B2

(12) United States Patent
Sakamitsu et al.

(10) Patent No.: US 12,625,207 B2
(45) Date of Patent: May 12, 2026

(54) MRI APPARATUS AND AMPLIFYING APPARATUS

(71) Applicant: CANON MEDICAL SYSTEMS CORPORATION, Otawara (JP)

(72) Inventors: Aoi Sakamitsu, Utsunomiya (JP); Kosuke Hayashi, Nasushiobara (JP); Mitsuyuki Murakami, Nasushiobara (JP); Hirofumi Yamaki, Nasushiobara (JP); Masahiko Ono, Nasushiobara (JP)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 110 days.

(21) Appl. No.: 18/668,310

(22) Filed: May 20, 2024

(65) Prior Publication Data

US 2025/0004078 A1     Jan. 2, 2025

(30) Foreign Application Priority Data

May 31, 2023     (JP) ................................. 2023-089913

(51) Int. Cl.
G01R 33/36          (2006.01)
(52) U.S. Cl.
CPC ..... G01R 33/3628 (2013.01); G01R 33/3614 (2013.01)
(58) Field of Classification Search
CPC ........................ G01R 33/3614; G01R 33/3628
See application file for complete search history.

(56) References Cited

U.S. PATENT DOCUMENTS

| | | | |
|---|---|---|---|
| 6,369,550 B1 * | 4/2002 | Lou | G05F 1/70 |
| | | | 323/280 |
| 2015/0017934 A1 * | 1/2015 | Yamaoka | H04B 1/0458 |
| | | | 455/114.3 |
| 2019/0049532 A1 * | 2/2019 | Wang | H03F 3/211 |
| 2021/0063513 A1 | 3/2021 | Tanji et al. | |

FOREIGN PATENT DOCUMENTS

JP          2021-37158 A     3/2021

* cited by examiner

*Primary Examiner* — Gregory H Curran
(74) *Attorney, Agent, or Firm* — Oblon, McClelland, Maier & Neustadt, L.L.P.

(57)               ABSTRACT
In one embodiment, an MRI apparatus comprising an amplifying apparatus configured to supply an amplified RF signal to a load, wherein the amplifying apparatus comprises a plurality of parallel element circuits, each of which includes two amplification circuits installed in parallel and an impedance conversion circuit provided between the load and an output terminal of at least one of the two amplification circuits. The impedance conversion circuit is configured in such a manner that; a polarity of reactance as viewed from an output terminal of one of the two amplification circuits toward the load is opposite to a polarity of reactance as viewed from an output terminal of another of the two amplification circuits toward the load; and impedance as viewed from the output terminal of at least one of the two amplification circuits toward the load via the impedance conversion circuit differs between the plurality of parallel element circuits.

11 Claims, 18 Drawing Sheets

COMPARATIVE EXAMPLE 2

AMPLIFYING APPARATUS

FIRST AMPLIFICATION CIRCUIT

SECOND AMPLIFICATION CIRCUIT

RFin

DIVIDER

COMBINER

ISOLATOR

RFout

LOAD

80

64, 164, 264
65, 165, 265
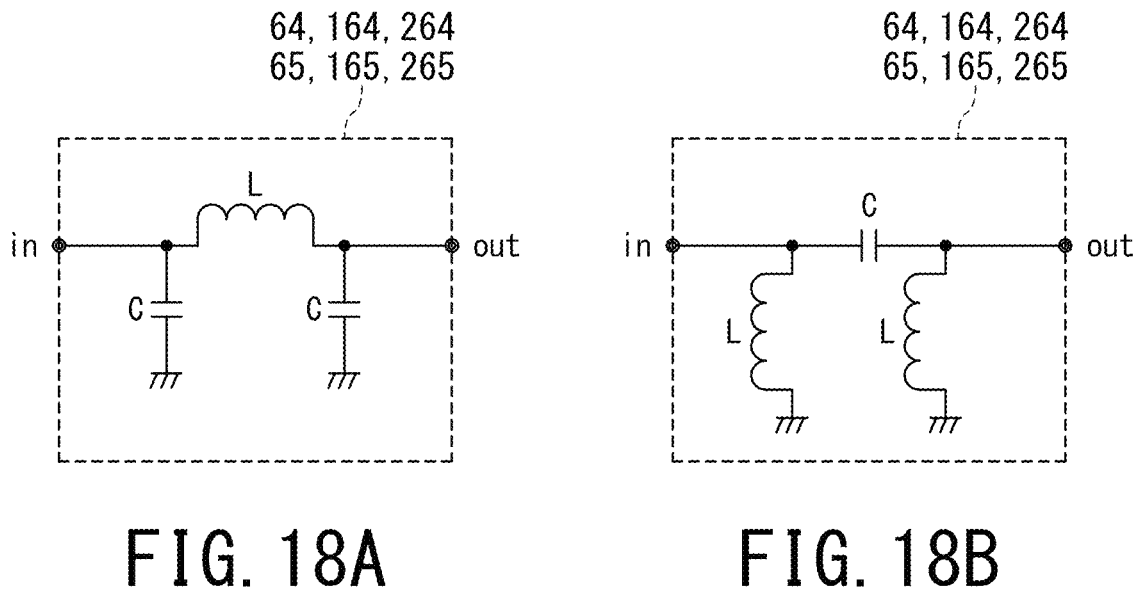
FIG. 18A
64, 164, 264
65, 165, 265
FIG. 18B
64, 164, 264
65, 165, 265
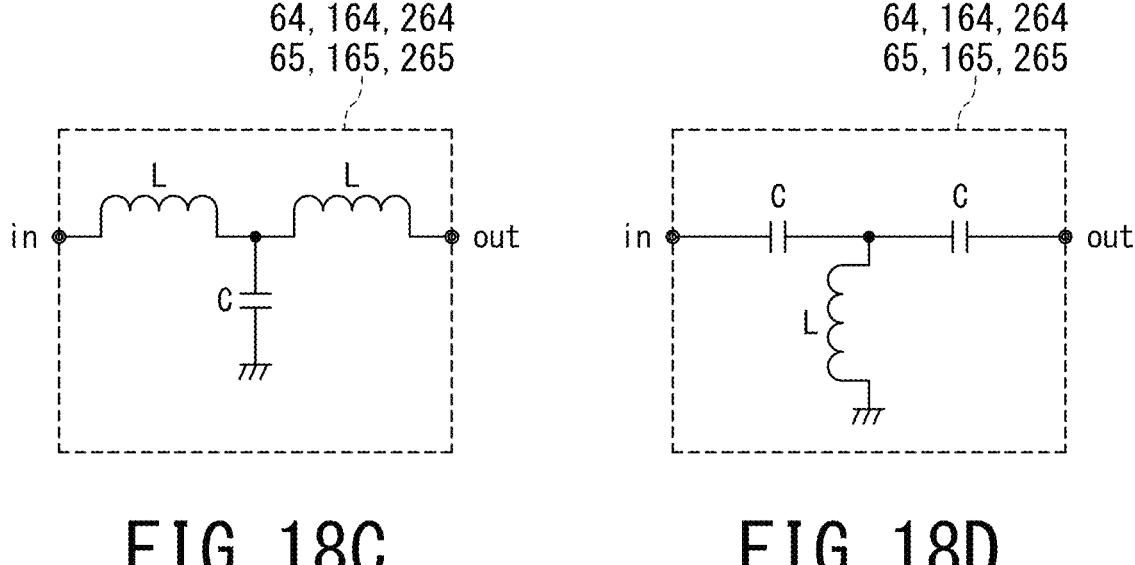
FIG. 18C
64, 164, 264
65, 165, 265
FIG. 18D

1

MRI APPARATUS AND AMPLIFYING APPARATUS

CROSS-REFERENCE TO RELATED APPLICATION

This application claims the benefit of priority of Japanese Patent Application No. 2023-089913, filed on May 31, 2023, the entire contents of which are incorporated herein by reference.

FIELD

Disclosed Embodiments relate to a magnetic resonance imaging (MRI) apparatus and an amplifying apparatus.

BACKGROUND

An MRI apparatus is an imaging apparatus that magnetically excites nuclear spin of an object placed in a static magnetic field with a radio frequency (RF) signal having the Larmor frequency and reconstructs an image on the basis of magnetic resonance (MR) signals emitted from the object due to the excitation.

Application of the RF signal to the object is performed by: placing the object in a space surrounded by a cylindrical RF coil called a whole body (WB) coil; and applying a high-power RF signal amplified by an RF amplifier to the RF coil, for example.

In such an environment, the load of the RF amplifier includes not only the RE coil but also the object. In other words, the load of the RF amplifier also changes due to factors excluding the RF coil, as exemplified by the physique and posture of the object placed inside the RF coil, the relative positional relationship of the object with respect to the RF coil, and the body motion of the object. For example, it is known that the load of the RF amplifier shows various changes due to the factors related to the object other than the RF coil, resulting in not only a resistive load but also an inductive load or a capacitive load.

Conventionally, a high-power isolator is provided between the output terminal of the RF amplifier and the RE coil in order to suppress the influence of the above-described load changes. However, the high-power isolator is large in physical size and is expensive. In addition, the high-power isolator has a limit on its maximum output, which affects the output characteristics of the RF amplifier in some cases.

2

Figure 5:
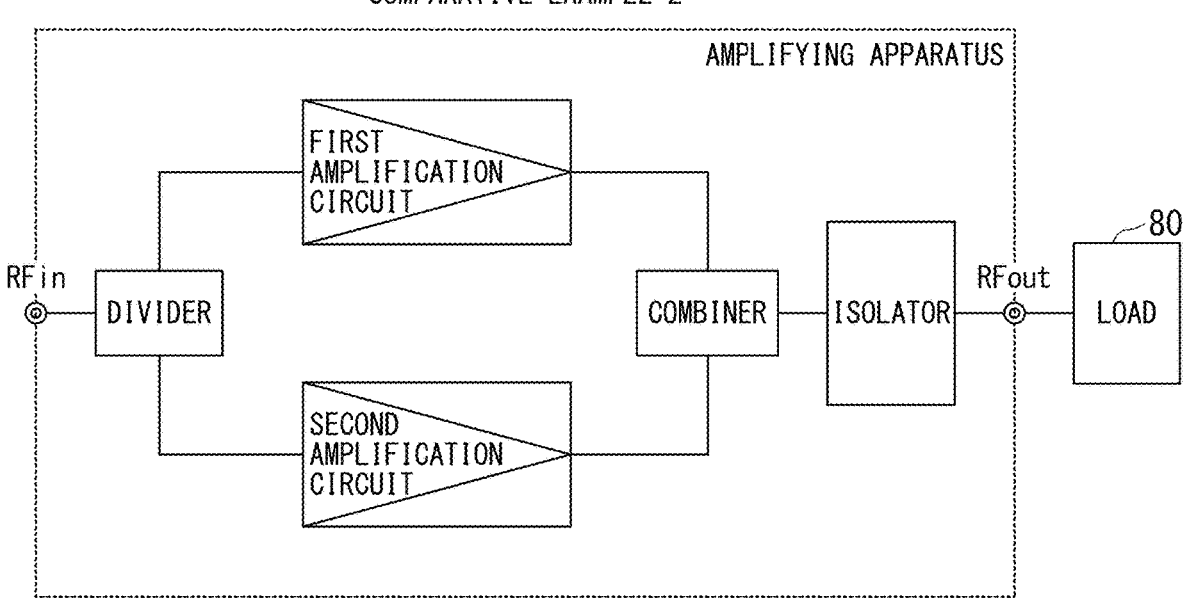
Figure 8:
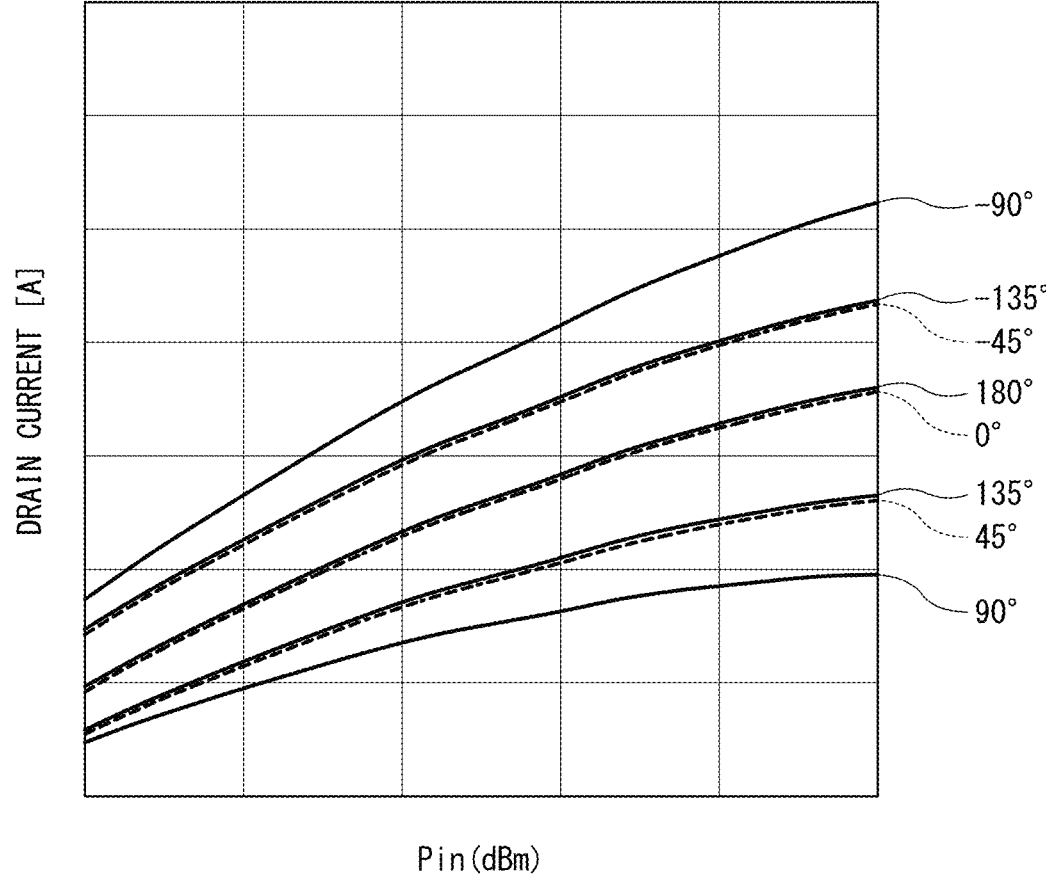
Figure 9:
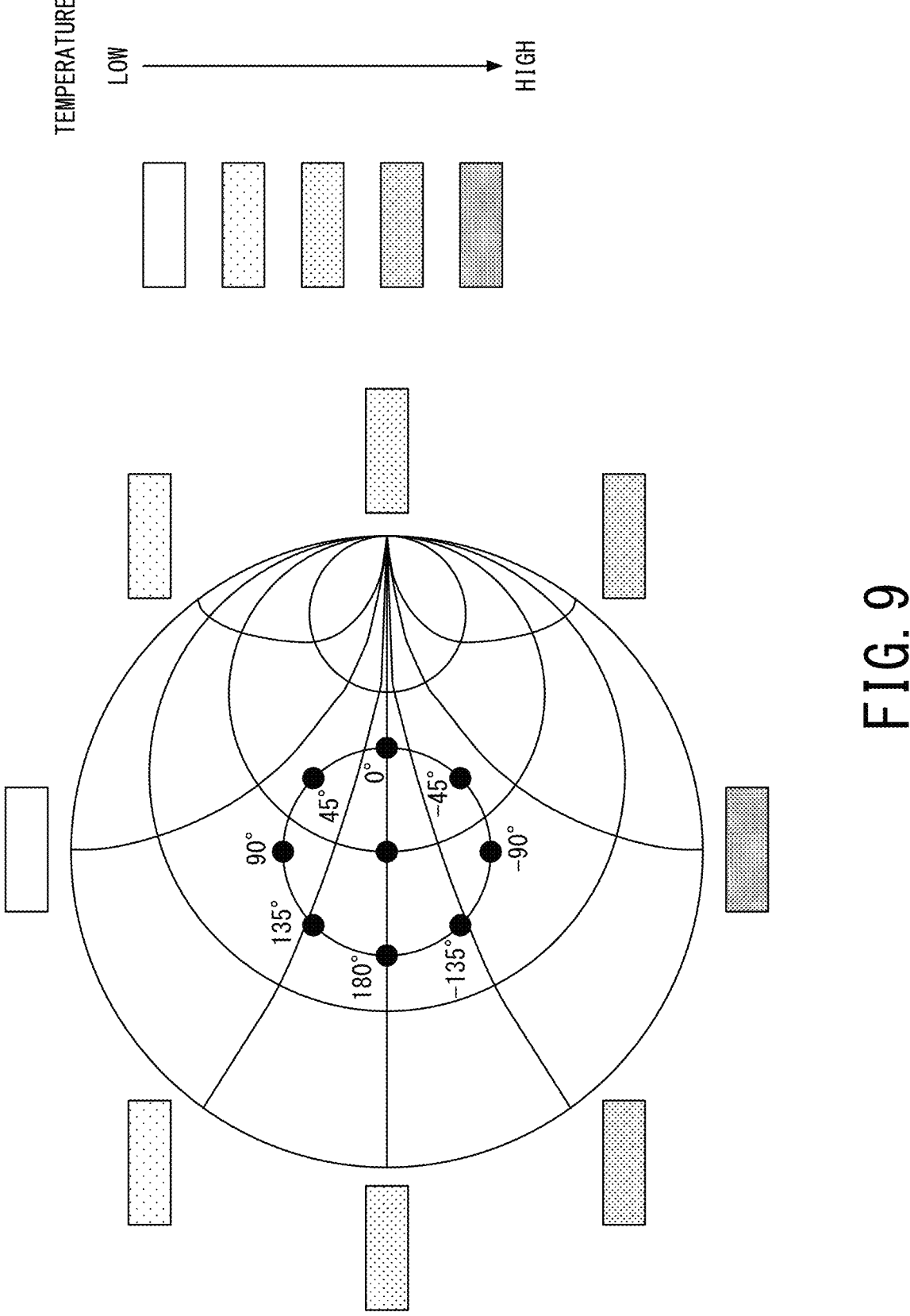
Figure 10A:
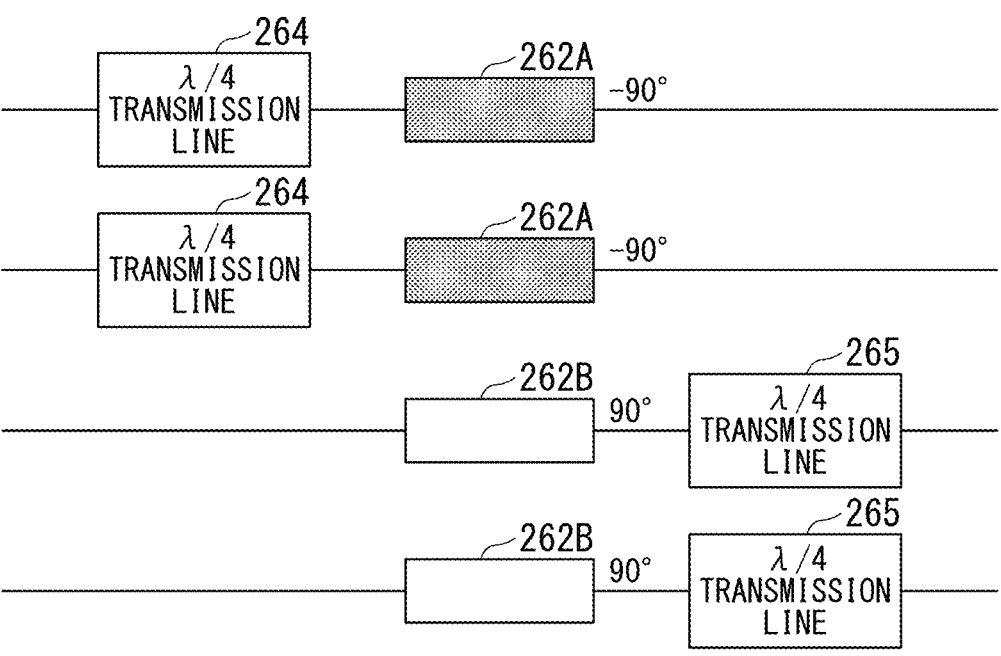
Figure 10B:
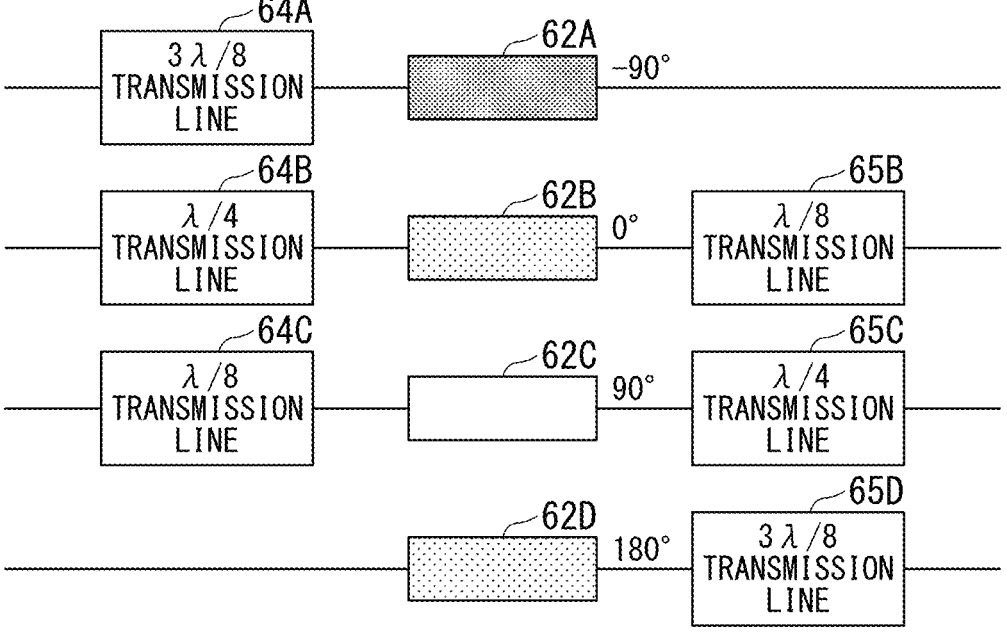
Figure 11:
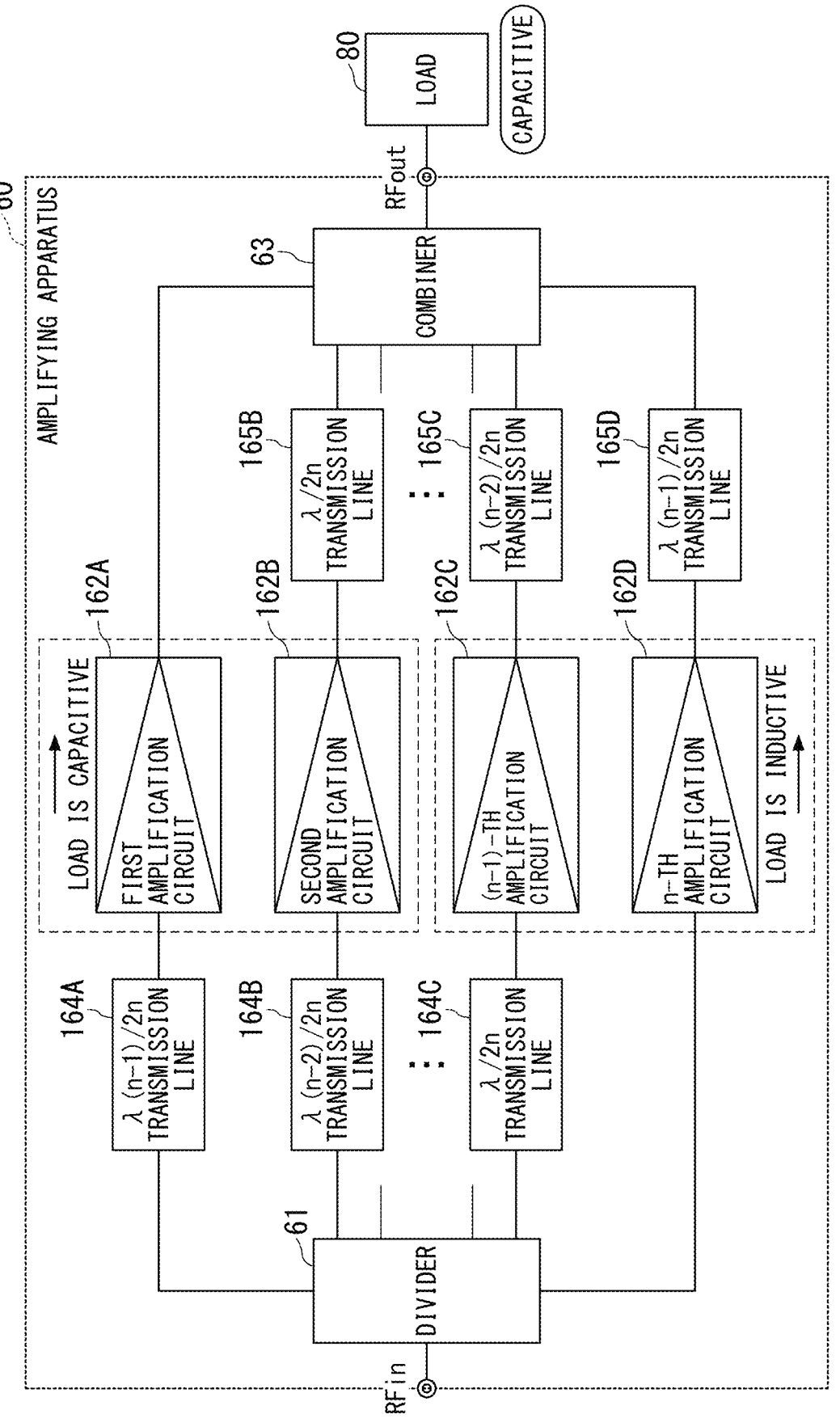
Figure 12:
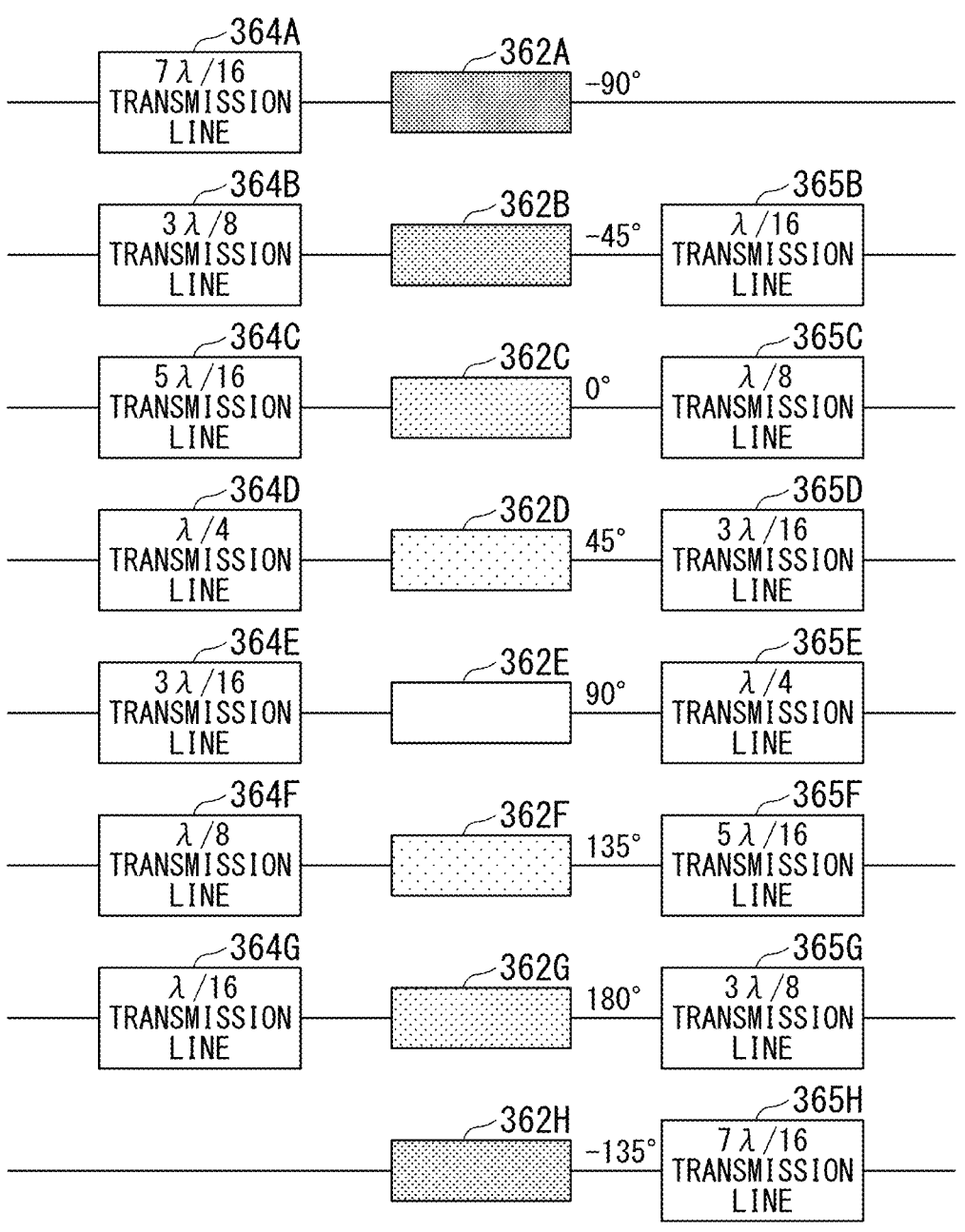
Figure 13:
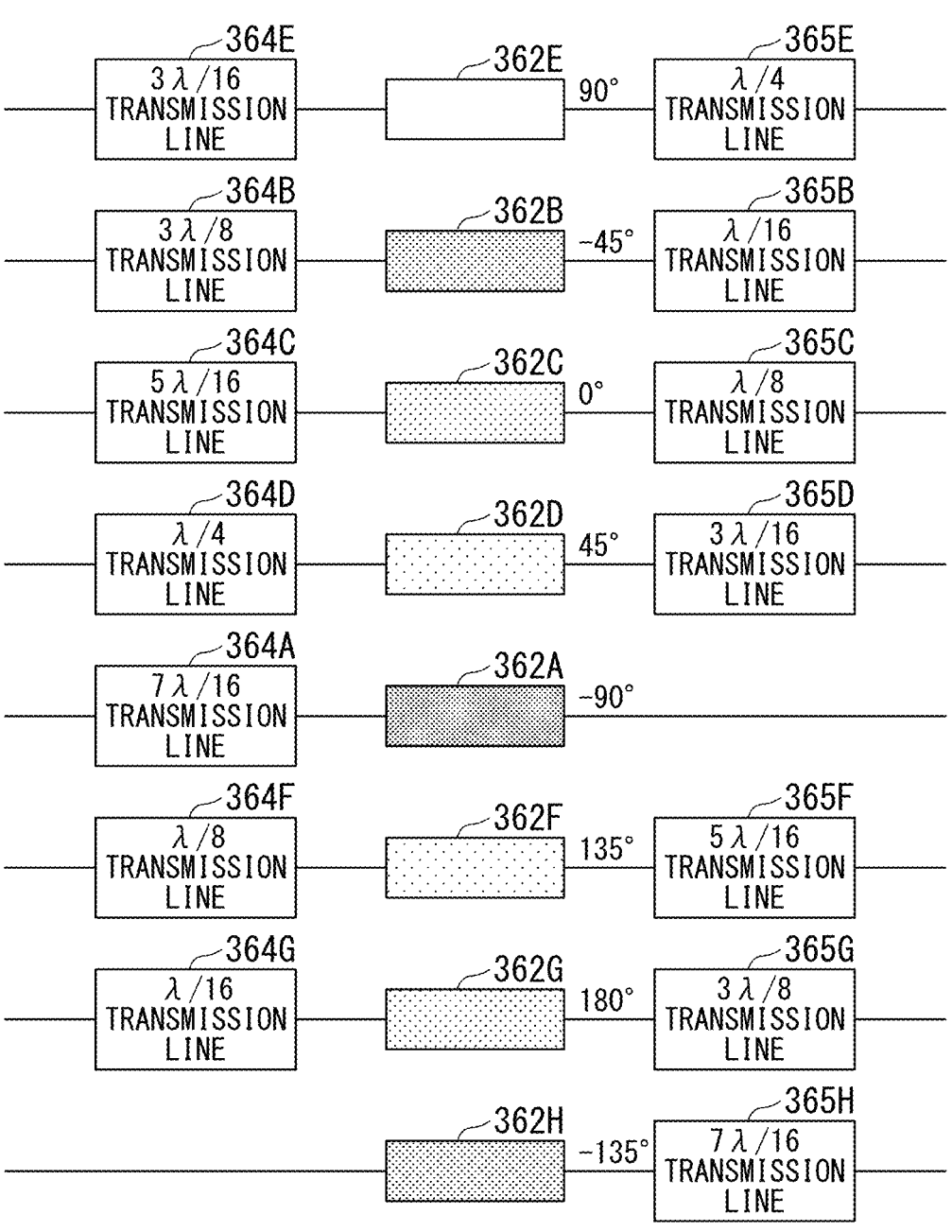
Figure 14:
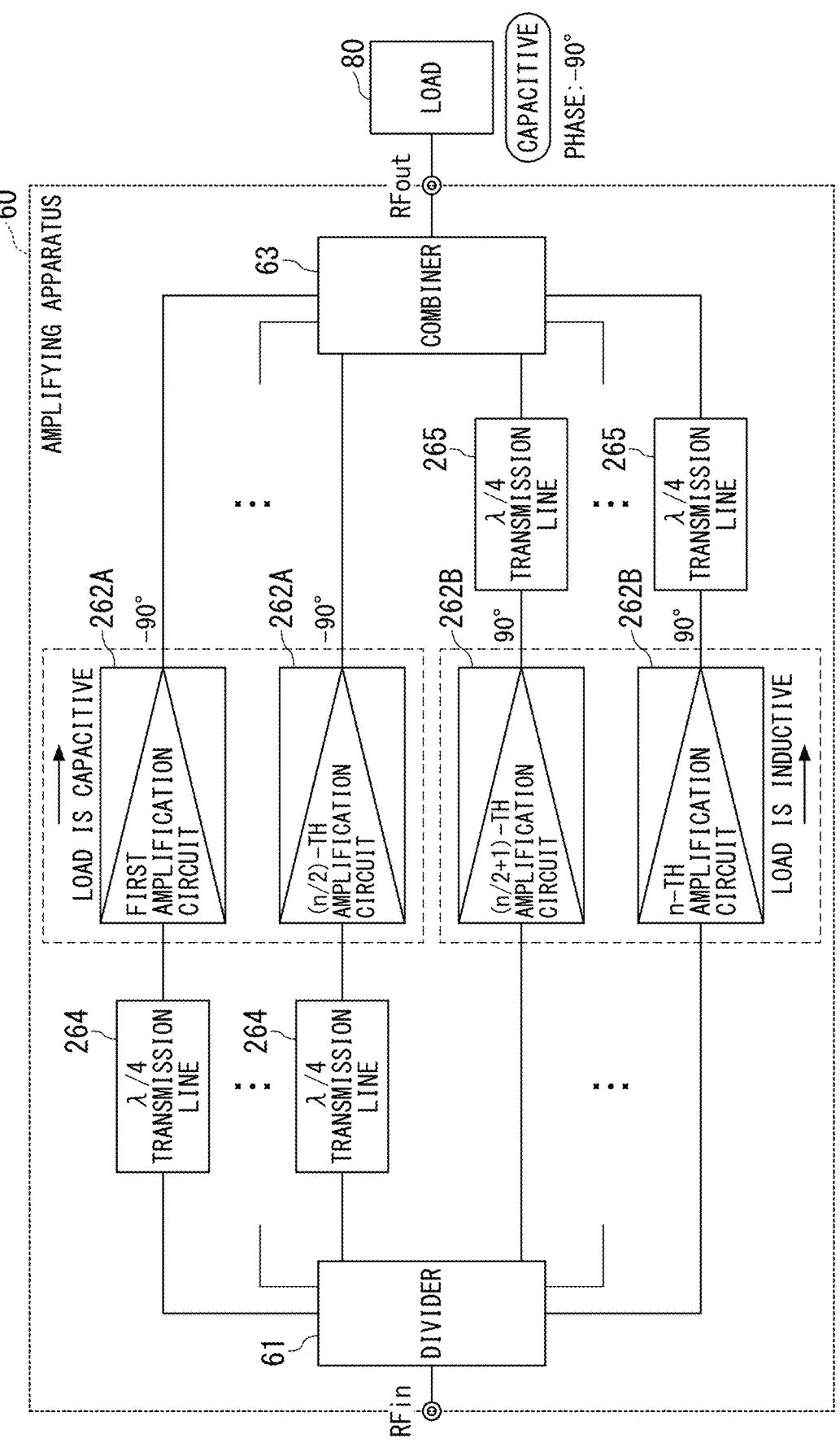
Figure 15:
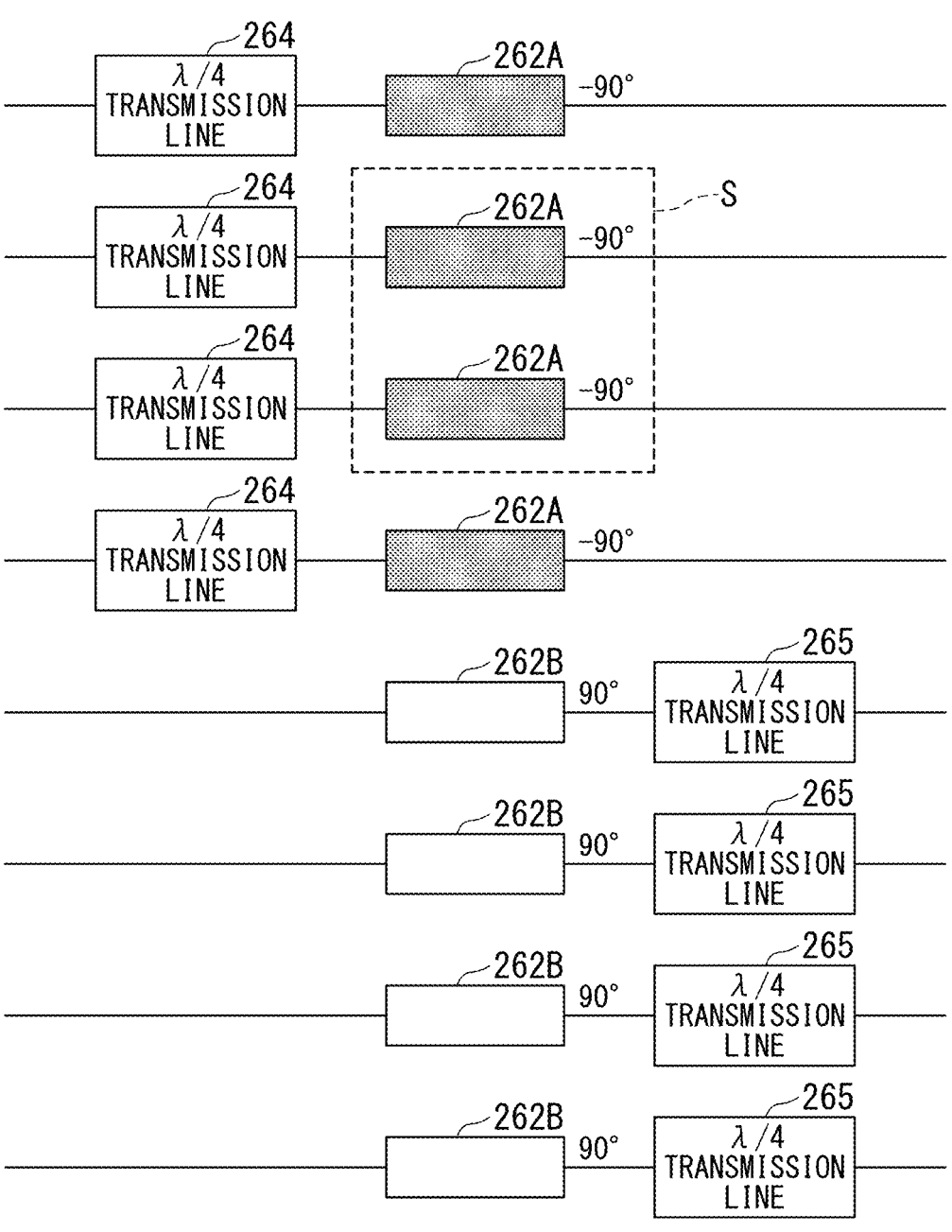
Figure 16:
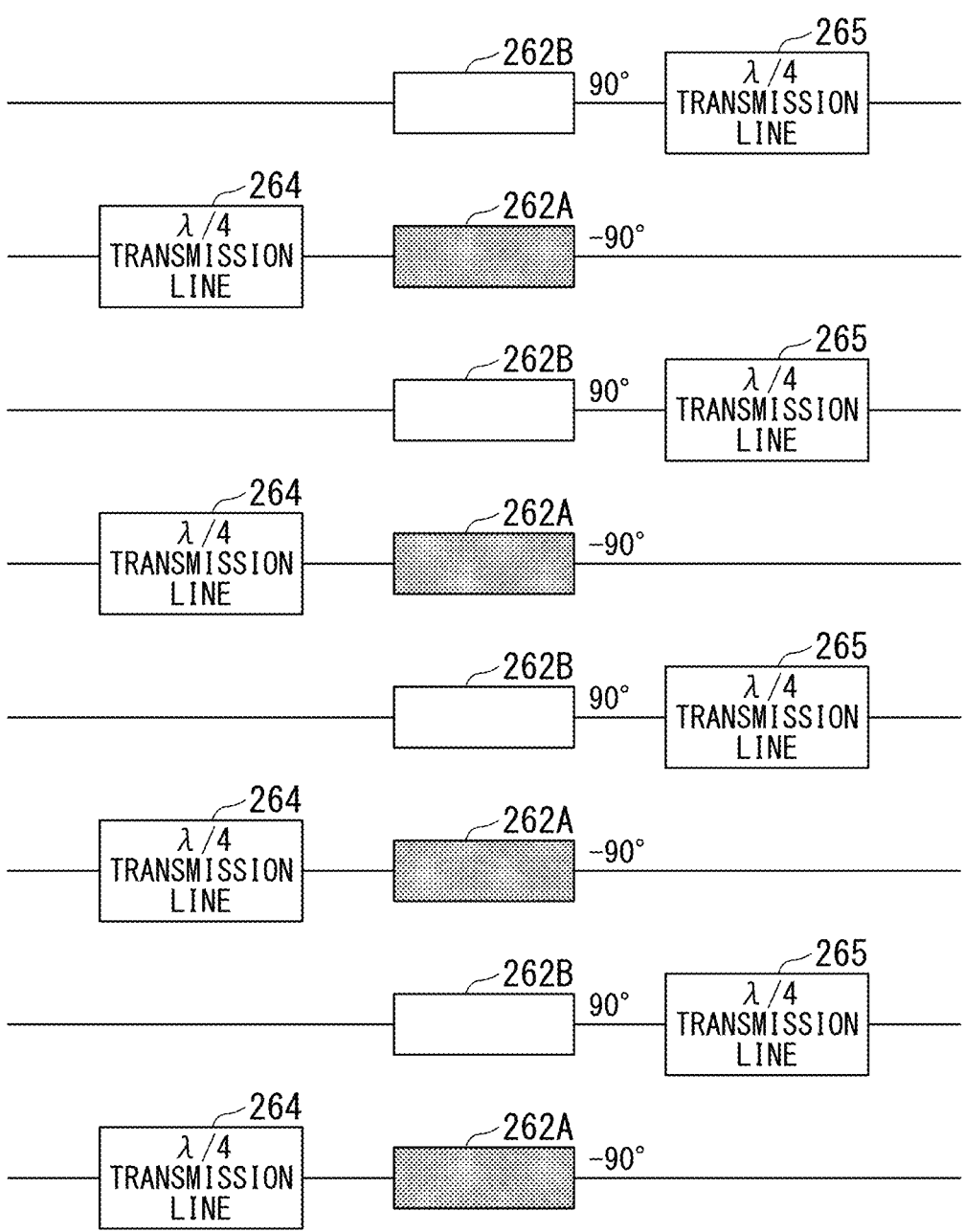
Figure 17:
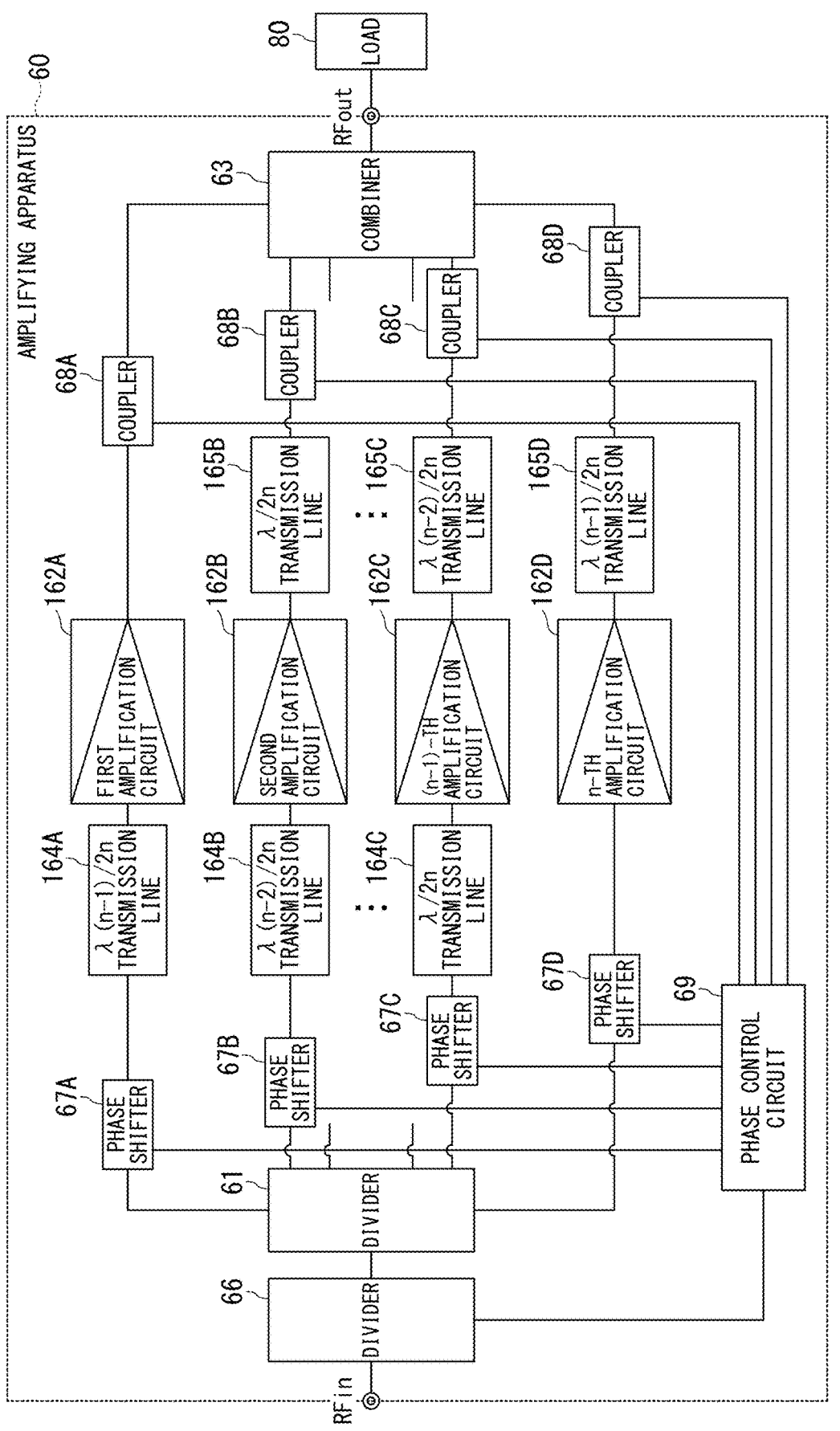

FIG. 5 is a block diagram showing a configuration of another conventional amplifying apparatus as Comparative Example 2 for illustrating another conventional problem;

FIGS. 6A, 6B, 6C, and 6D are schematic diagrams illustrating the operation and effects of the amplifying apparatus in the case of a capacitive load;

FIGS. 7A, 7B, 7C, and 7D are schematic diagrams illustrating the operation and effects of the amplifying apparatus in the case of an inductive load;

FIG. 8 is a graph illustrating a drain current of an amplification circuit based on a phase of the load;

FIG. 9 is a schematic diagram illustrating relationship between the phase of the load and heat generation in a Smith chart;

FIG. 10A and FIG. 10B are schematic diagrams illustrating heat dispersion of the amplification circuits and their layout in the amplifying apparatus;

FIG. 11 is a block diagram illustrating a configuration of an amplifying apparatus according to a modification of the first embodiment;

FIG. 12 is a schematic diagram illustrating a first layout of a plurality of amplification circuits in the amplifying apparatus;

FIG. 13 is a schematic diagram illustrating a second layout of a plurality of amplification circuits in the amplifying apparatus;

FIG. 14 is a block diagram illustrating a configuration of an amplifying apparatus according to the second embodiment;

FIG. 15 is a schematic diagram illustrating heat dispersion of the amplification circuits and their layout in the amplifying apparatus;

FIG. 16 is a schematic diagram illustrating a layout of a plurality of amplification circuits in the amplifying apparatus according to the second embodiment;

FIG. 17 is a block diagram illustrating a configuration of an amplifying apparatus according to the third embodiment; and FIG. 18A to FIG. 18D are circuit diagrams, in each of an input-side transmission line and an output-side transmission line of an amplifying apparatus according to the fourth embodiment are achieved by an LC circuit.

DETAILED DESCRIPTION

Hereinbelow, a description will be given of MRI apparatuses and amplifying apparatuses according to embodiments of the present invention by referring to the accompanying drawings.

In one embodiment, an MRI apparatus comprising an RF coil configured to apply an RF (Radio Frequency) signal of a Larmor frequency to an object, and an amplifying apparatus configured to amplify the RF signal and supply the amplified RF signal to a load that includes at least the RF coil and the object. Wherein the amplifying apparatus comprises a plurality of parallel element circuits, each of which includes two amplification circuits installed in parallel and an impedance conversion circuit provided between the load and an output terminal of at least one of the two amplification circuits; the impedance conversion circuit is configured in such a manner that, in each of the plurality of parallel element circuits, a polarity of reactance as viewed from an output terminal of one of the two amplification circuits toward the load is opposite to a polarity of reactance as viewed from an output terminal of another of the two amplification circuits toward the load; and the impedance conversion circuit is further configured in such a manner that impedance as viewed from the output terminal of at least one of the two amplification circuits toward the load via the impedance conversion circuit is different between the plurality of parallel element circuits.

(MRI Apparatus)

Figure 1:
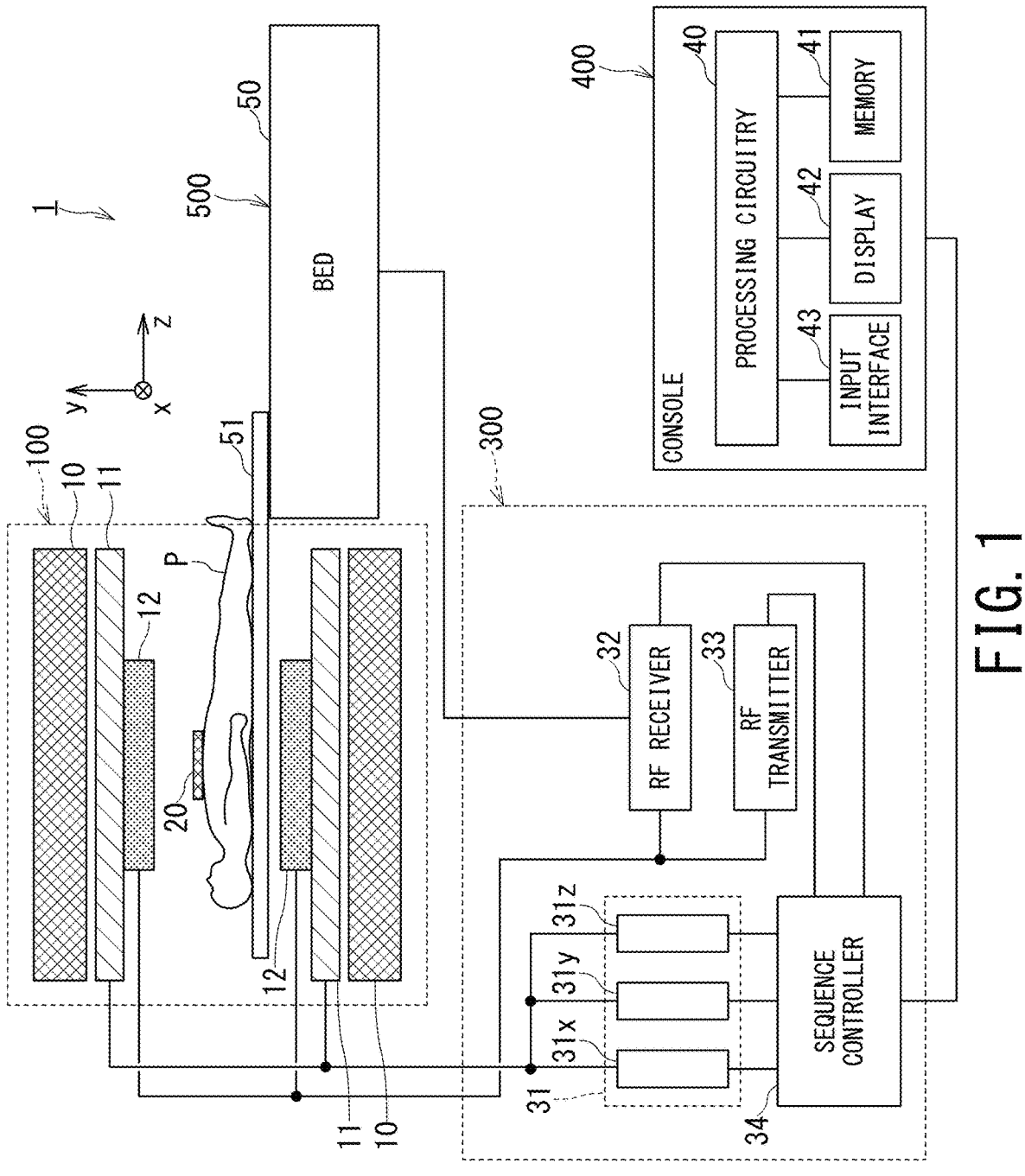
FIG. 1 is a block diagram illustrating an overall configuration of an MRI apparatus according to one embodiment.

FIG. 1 is a block diagram illustrating an overall configuration of an MRI apparatus 1 according to one embodiment. The MRI apparatus 1 according to the embodiment includes a gantry 100, a control cabinet 300, a console 400, and a bed 500.

The gantry 100 includes a static magnetic field magnet 10, a gradient coil 11, and an RF coil 12, and these components are housed in a cylindrical housing. The bed 500 includes a bed body 50 and a table 51. The MRI apparatus 1 includes at least one local coil 20 to be disposed close to an object P such as a patient.

The control cabinet 300 includes a gradient coil power supply 31 which applies power along each of three axes, 31x for an X-axis, 31y for a Y-axis, and 31z for a Z-axis, an RF receiver 32, an RF transmitter 33, and a sequence controller 34.

The static magnetic field magnet 10 of the gantry 100 is substantially in the form of a cylinder and generates a static magnetic field inside a bore, which is a space inside the cylindrical structure of the static magnetic field magnet 10 and is also an imaging region of the object P. The static magnetic field magnet 10 includes a superconducting coil inside, and the superconducting coil is cooled down to an extremely low temperature by liquid helium. The static magnetic field magnet 10 generates a static magnetic field by supplying the superconducting coil with an electric current provided from a static magnetic field power supply (not shown) in an excitation mode. Afterward, the static magnetic field magnet 10 shifts to a persistent current mode, and the static magnetic field power supply is disconnected. Once it enters the persistent current mode, the static magnetic field magnet 10 continues to generate a strong static magnetic field for a long time, for example, over one year. Note that the static magnetic field magnet 10 may be configured as a permanent magnet.

The gradient coil 11 is also substantially in the form of a cylinder and is fixed to the inside of the static magnetic field magnet 10. This gradient coil 11 applies gradient magnetic fields to the object P in the respective directions of the X-axis, the Y-axis, and the Z-axis by using electric currents supplied from the gradient coil power supply 31 (31x, 31y, and 31z).

The bed body 50 of the bed 500 can move the table 51 in the vertical direction, and moves the table 51 with the object P placed thereon to a predetermined height before imaging. Afterward, the bed body 50 moves the table 51 in the horizontal direction so as to move the object P to the inside of the bore.

The RF coil 12 is also called a whole body (WB) coil or a birdcage coil. The RF coil 12 is shaped substantially in the form of a cylinder to surround the object P and is fixed to the inside of the gradient coil 11. The RF coil 12 applies RF pulses transmitted from the RF transmitter 33 to the object, and receives MR signals emitted from the object P due to excitation of hydrogen nuclei.

The local coil 20 receives MR signals emitted from the object P at a position close to the body surface of the object P. The local coil 20 includes a plurality of coil elements, for example. There are various types of local coils 20 for different anatomical imaging part of the object P, such as the head, the chest, the spine, the lower limbs, and the whole body. FIG. 1 illustrates the local coil 20 for the chest.

The RF transmitter 33 transmits each RF pulse to the RF coil 12 on the basis of an instruction from the sequence controller 34. The RF transmitter 33 includes an amplifying apparatus described below. The RF receiver 32 detects MR signals received by the RF coil 12 and/or the local coil 20, digitizes the detected MR signals to acquire raw data, and transmits the acquired raw data to the sequence controller 34.

The sequence controller 34 performs a scan of the object P by driving the gradient coil power supply 31, the RF transmitter 33, and the RF receiver 32 under the control of the console 400. The sequence controller 34 receives the raw data acquired by the scan from the RF receiver 32, and transmits the raw data to the console 400.

The sequence controller 34 includes processing circuitry (not shown). This processing circuitry is configured as a processor that executes predetermined programs or is configured as hardware such as a field programmable gate array (FPGA) and an application specific integrated circuit (ASIC), similarly to processing circuitry 40 of the console 400 described below, for example.

The console 400 is configured as a computer that includes the processing circuitry 40, a memory 41, a display 42, and an input interface 43.

The memory 41 is a recording medium including a read-only memory (ROM) and/or a random access memory (RAM) in addition to an external memory device such as a hard disk drive (HDD) and an optical disc device. The memory 41 stores various programs to be executed by the processor of the processing circuitry 40 as well as various data and information.

The input interface 43 includes various devices for a user to input various data and information, and is composed of a mouse, a keyboard, a trackball, and/or a touch panel, for example.

The display 42 is a display device such as a liquid crystal display panel, a plasma display panel, and an organic EL panel.

The processing circuitry 40 is a circuit provided with a central processing unit (CPU) and/or a special-purpose or general-purpose processor, for example. The processor implements various functions described below by executing the programs stored in the memory 41. The processing circuitry 40 may be configured of hardware such as an FPGA and an ASIC. Additionally, the processing circuitry 40 can implement various functions by combining hardware processing and software processing based on its processor and programs.

The console 400 controls the entirety of the MRI apparatus 1 by using these components. Specifically, the console 400 receives various information items and instructions including imaging conditions through the input interface 43 operated by a user such as a medical imaging technologist. The processing circuitry 40 causes the sequence controller 34 to perform a scan on the basis of the inputted imaging conditions, and reconstructs images on the basis of the raw data transmitted from the sequence controller 34. The reconstructed images are displayed on the display 42 or stored in the memory 41.

First Embodiment of Amplifying Apparatus

Figure 2:
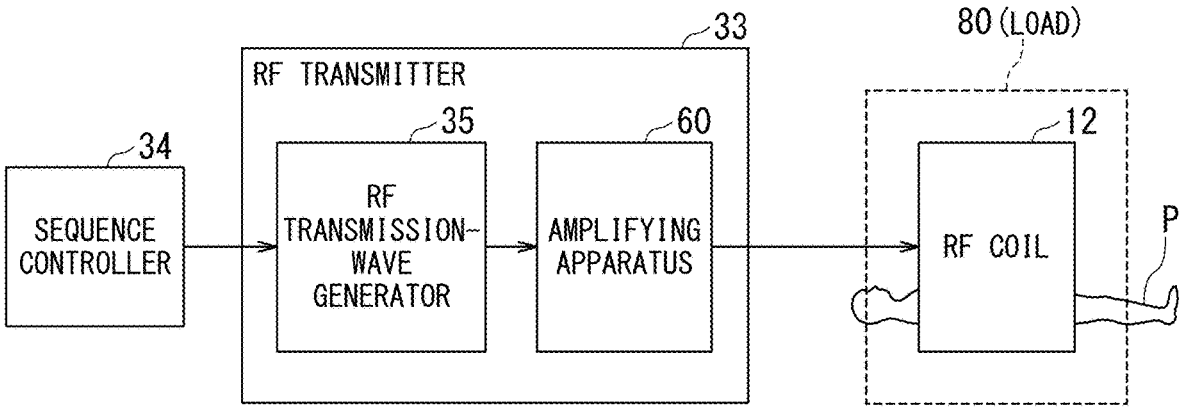
FIG. 2 is a block diagram illustrating relationship between an amplifying apparatus and the MRI apparatus according to the embodiment.

FIG. 2 is a block diagram illustrating relationship between the MRI apparatus 1 and an amplifying apparatus 60 of the first embodiment. The RF transmitter 33 outputs RF pulses to the RF coil 12 on the basis of an instruction from the sequence controller 34 as described above.

The RF transmitter 33 includes at least an RF transmission-wave generator 35 and the amplifying apparatus 60 as shown in FIG. 2. The RF transmission-wave generator 35 generates an RF pulse train in the Larmor frequency band based on various imaging conditions and a pulse sequence, as an RF transmission wave.

The amplifying apparatus 60 amplifies the generated RF transmission wave to a predetermined high power and outputs the amplified RF transmission wave to the RF coil 12. The RF coil 12 is, for example, a cylindrical WB coil. In the internal space of the RF coil 12, the object P to be imaged is placed. Thus, a load 80 of the amplifying apparatus 60 includes not only the RF coil 12 but also part or all of the object P. Hence, even when load matching is satisfactorily achieved between the RF coil 12 and the amplifying apparatus 60, the effective load changes due to the object P placed in the internal space of the RF coil 12, and consequently, load mismatch may occur.

The effective load can change depending on factors related to the object P, such as the physique and posture of the object P, the relative positional relationship between the object P and the RF coil 12, and the body motion of the object P. The load of the amplifying apparatus 60 includes the object P and the RF coil 12, and further includes the local coil 20 in the case of using the local coil 20. Thus, the load of the amplifying apparatus 60 can have a reactance component as well as a resistive component (for example, 50 ohm). In this case, the magnitude and polarity of the reactance component also change due to the factors related to object P. When the reactance component has a positive polarity, the load of the amplifying apparatus 60 becomes an inductive load. When the reactance component has a negative polarity, the load of the amplifying apparatus 60 becomes a capacitive load.

Figure 3:
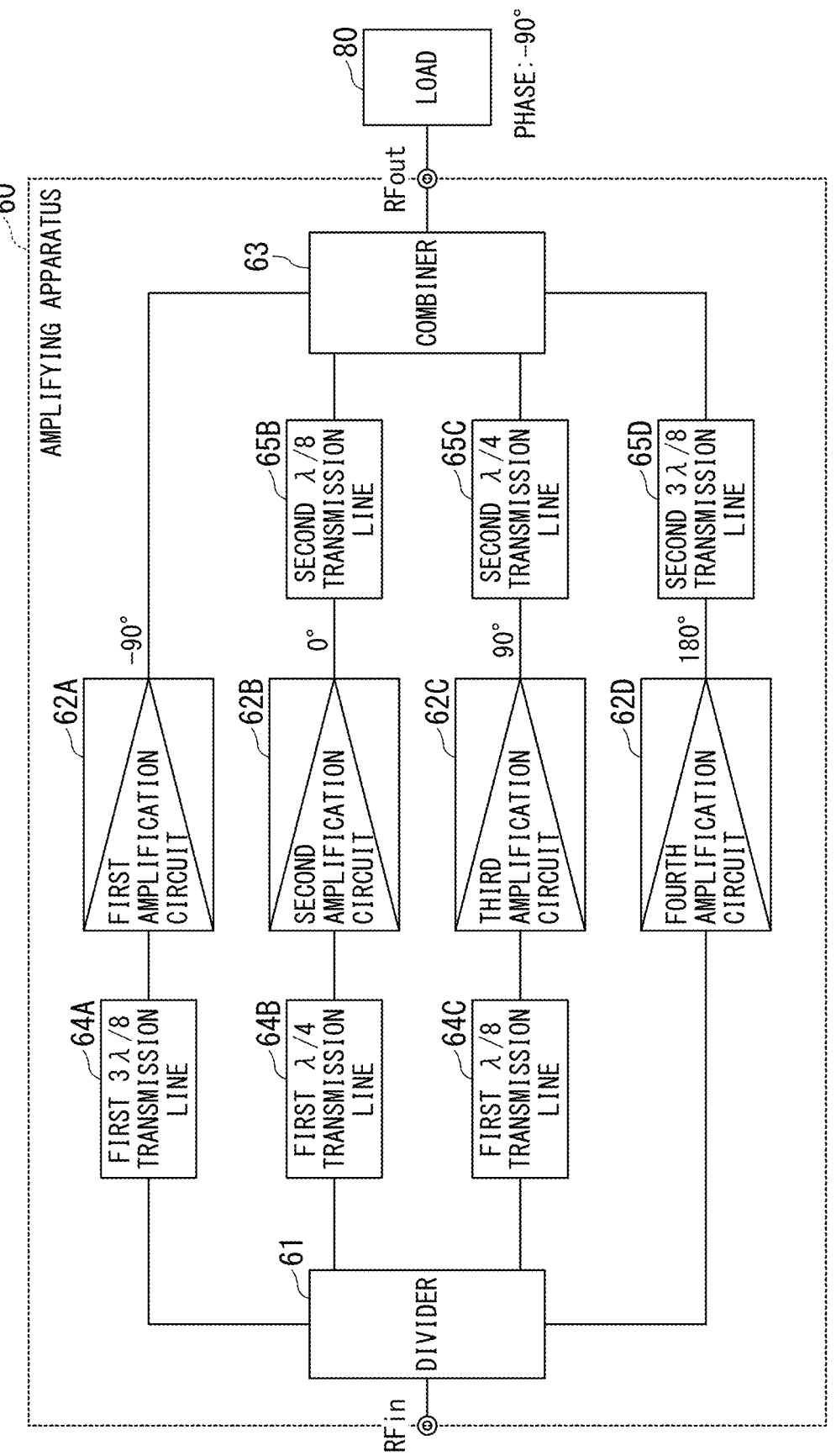
FIG. 3 is a block diagram illustrating a configuration of the amplifying apparatus according to the first embodiment.

FIG. 3 is a block diagram illustrating a configuration of the amplifying apparatus 60 according to the first embodiment. The amplifying apparatus 60 includes a divider 61, a first 3λ/8 transmission line 64A, a first λ/4 transmission line 64B, a first λ/8 transmission line 64C, a first amplification circuit 62A, a second amplification circuit 62B, a third amplification circuit 62C, a fourth amplification circuit 62D, a second λ/8 transmission line 65B, a second λ/4 transmission line 65C, a second 3λ/8 transmission line 65D, and a combiner 63. The first 3λ/8 transmission line 64A is an input-side transmission line having a transmission line length corresponding to a ⅜ wavelength. The first λ/4 transmission line 64B is an input-side transmission line with a transmission line length corresponding to a quarter wavelength. The first λ/8 transmission line 64C is an input-side transmission line with a transmission line length corresponding to a one-eighth wavelength. The second λ/8 transmission line 65B is an output-side transmission line with a transmission line length corresponding to a one-eighth wavelength. The second λ/4 transmission line 65C is an output-side transmission line with a transmission line length corresponding to a quarter wavelength. The second 3λ/8 transmission line 65D is an output-side transmission line with a transmission line length corresponding to a three-eighths wavelength.

The divider 61 divides an input signal RFin outputted from the RF transmission-wave generator 35 into a first input signal, a second input signal, a third input signal, and a fourth input signal.

The first amplification circuit 62A amplifies the first input signal. The first 3λ/8 transmission line 64A is provided between the divider 61 and the input terminal of the first amplification circuit 62A.

The second amplification circuit 62B amplifies the second input signal. The first λ/4 transmission line 64B is provided between the divider 61 and the input terminal of the second amplification circuit 62B. The second λ/8 transmission line 65B is provided between the output terminal of the second amplification circuit 62B and the combiner 63.

The third amplification circuit 62C amplifies the third input signal. The first λ/8 transmission line 64C is provided between the divider 61 and the input terminal of the third amplification circuit 62C. The second λ/4 transmission line 65C is provided between the combiner 63 and the output terminal of the third amplification circuit 62C.

The fourth amplification circuit 62D amplifies the fourth input signal. The second 3λ/8 transmission line 65D is provided between the combiner 63 and the output terminal of the fourth amplification circuit 62D.

The combiner 63 combines the first output signal outputted from the first amplification circuit 62A, the second output signal outputted from the second amplification circuit 62B, the third output signal outputted from the third amplification circuit 62C, and the fourth output signal outputted from the fourth amplification circuit 62D so as to output the combined signal to the load 80. As described below, the second λ/8 transmission line 65B, the second λ/4 transmission line 65C, and the second 3λ/8 transmission line 65D, which are the output-side transmission lines, function as impedance conversion circuits.

The amplifying apparatus 60 can supply the load 80 with a high-power high-frequency signal, which cannot be obtained with a single amplification circuit, by: dividing the input signal into four signals by using the divider 61; amplifying the divided four signals by using four amplification circuits of the first to fourth amplification circuits 62A, 62B, 62C, 62D; and then combining the amplified four signals.

The first 3λ/8 transmission line 64A, the first λ/4 transmission line 64B, the first λ/8 transmission line 64C, the second λ/8 transmission line 65B, the second λ/4 transmission line 65C, and the second 3λ/8 transmission line 65D are provided in order to suppress the influence of load change and are characteristic configurations of the amplifying apparatus 60 of the embodiment. Prior to a description of the operation and effects of the amplifying apparatus 60 configured as described above, a description will be given of amplifying apparatuses of comparative examples and their problems by referring to FIG. 4A to FIG. 5.

Figures 4A, 4B, 4C:
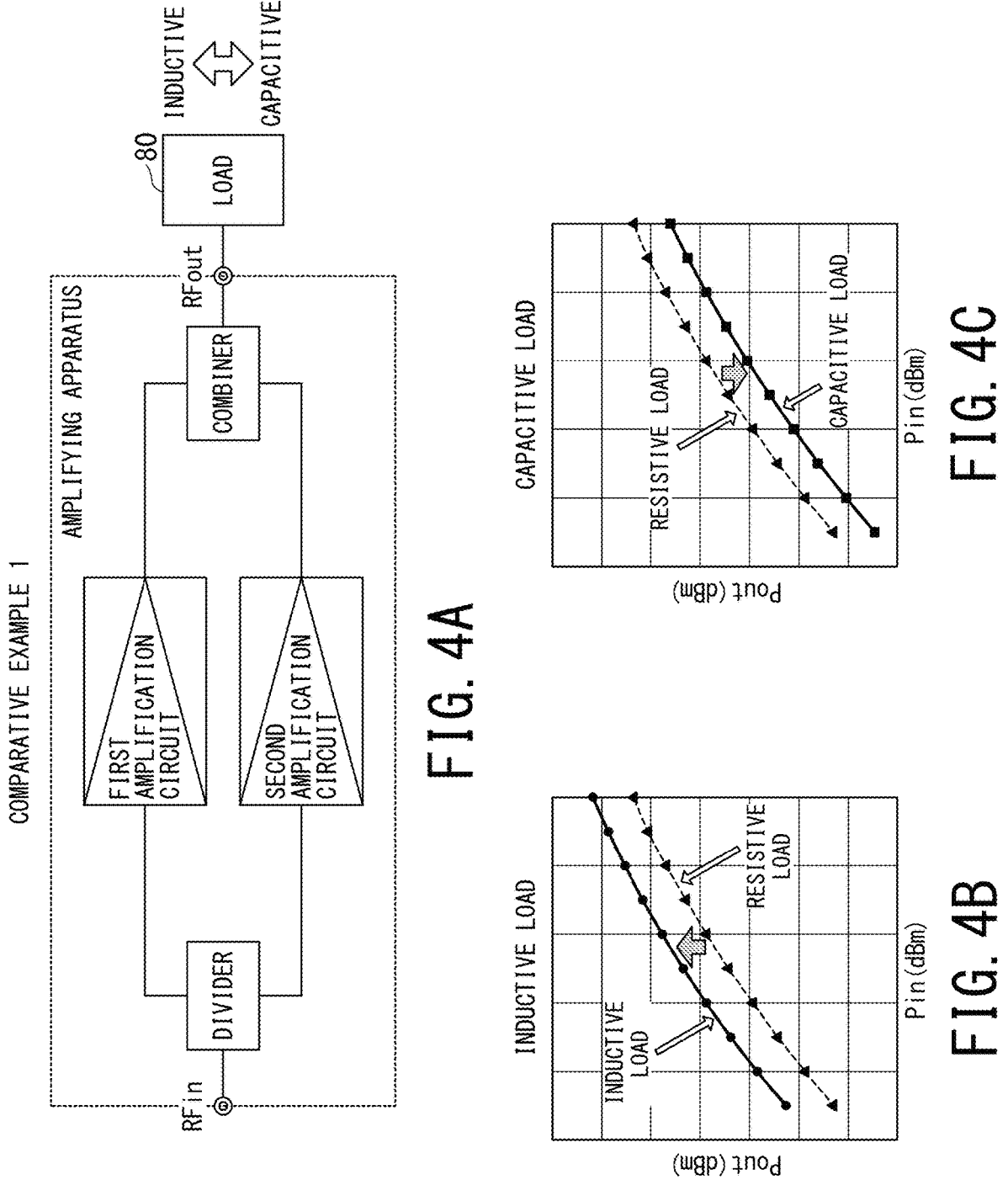
FIG. 4A is a block diagram illustrating a configuration of a conventional amplifying apparatus as Comparative Example 1.
FIG. 4B and FIG. 4C are schematic diagrams showing change in output characteristics of the amplification circuits in Comparative Example 1 for illustrating a conventional problem.

FIG. 4A is a block diagram illustrating a configuration of an amplifying apparatus according to Comparative Example 1. As can be seen by comparing FIG. 4A with FIG. 3, the amplifying apparatus of Comparative Example 1 does not include the input-side transmission lines 64A, 64B, 64C and the output-side transmission lines 65B, 65C, 65D.

In the MRI apparatus 1, depending on the factors related to the object P to be imaged, the load of the amplifying apparatus can change into not only a resistive load but also an inductive load or a capacitive load as described above. Such load change may generate load mismatch and consequently generate a reflected signal from the load toward the output terminal of each amplification circuit.

It is known that output characteristics of an amplification circuit change due to the influence of the load mismatch or the reflected signal. In particular, it is known that output characteristics of an amplification circuit change depending on whether the impedance as viewed from the output terminal of the amplification circuit toward the load is inductive or capacitive.

FIG. 4B and FIG. 4C are schematic graphs showing change in output characteristics of the amplification circuits of Comparative Example 1 caused by the load mismatch. FIG. 4B is a schematic diagram illustrating input/output characteristics of the amplification circuits when the load 80 is inductive. When the load 80 is inductive, the gain of the amplification circuits tends to increase as compared with the case where the load 80 is a resistive load.

FIG. 4C is a schematic diagram illustrating the input/output characteristics of the amplification circuits when the load 80 is capacitive. When the load 80 is capacitive, the gain of the amplification circuits tends to decrease as compared with the case where the load 80 is a resistive load. As described above, the direction of change in the gain of the amplification circuit (i.e., whether it increases or decreases) is known to be reversed depending on whether the load 80 is inductive or capacitive.

When the gain of the amplification circuit or the output power of the amplification circuit changes due to the change of the load 80 in this manner, it is inconvenient that power of an intended value cannot be supplied to the load 80.

FIG. 5 is a block diagram showing a configuration of an amplifying apparatus of Comparative Example 2 in which an isolator is provided between the load 80 and the combiner in order to avoid the above-described inconvenience. In the amplifying apparatus of Comparative Example 2, even if the load 80 changes and the load mismatch occurs, the reflected signal is absorbed by the isolator, so the reflected signal does not reach the output terminal of each amplification circuit. Thus, the above-described inconvenience does not occur.

However, as described above, the high-power isolator is large in physical size and is expensive. Further, the high-power isolator has a limit on its maximum output, which may affect the output characteristics of the amplification circuits.

Thus, in the amplifying apparatus 60 of the present embodiment, the input-side transmission lines 64A, 64B, 64C and the output-side transmission lines 65B, 65C, 65D are provided, and this configuration enables suppression of the influence of the load change without providing a high-power isolator. Hereinafter, the operation and effects of this configuration will be described by referring to FIG. 6A to FIG. 7D.

FIG. 6A to FIG. 6D are schematic diagrams illustrating the operation and effects of the amplifying apparatus 60 when the load 80 is capacitive. Of the configuration of the amplifying apparatus 60 according to the embodiment shown in FIG. 3, FIG. 6A extracts and shows only the parallel element circuit composed of the first amplification circuit 62A and the third amplification circuit 62C.

A parallel element circuit is a circuit that is composed of: two amplification circuits provided in parallel; and an impedance conversion circuit provided between a load and an output end of at least one of the two amplification circuits. An impedance conversion circuit is a circuit configured such that a polarity of reactance as viewed from an output terminal of one of two amplification circuits toward a load becomes opposite to a polarity of reactance as viewed from an output terminal of the other of two amplification circuits toward the load.

Figures 6A, 6B, 6C, 6D:
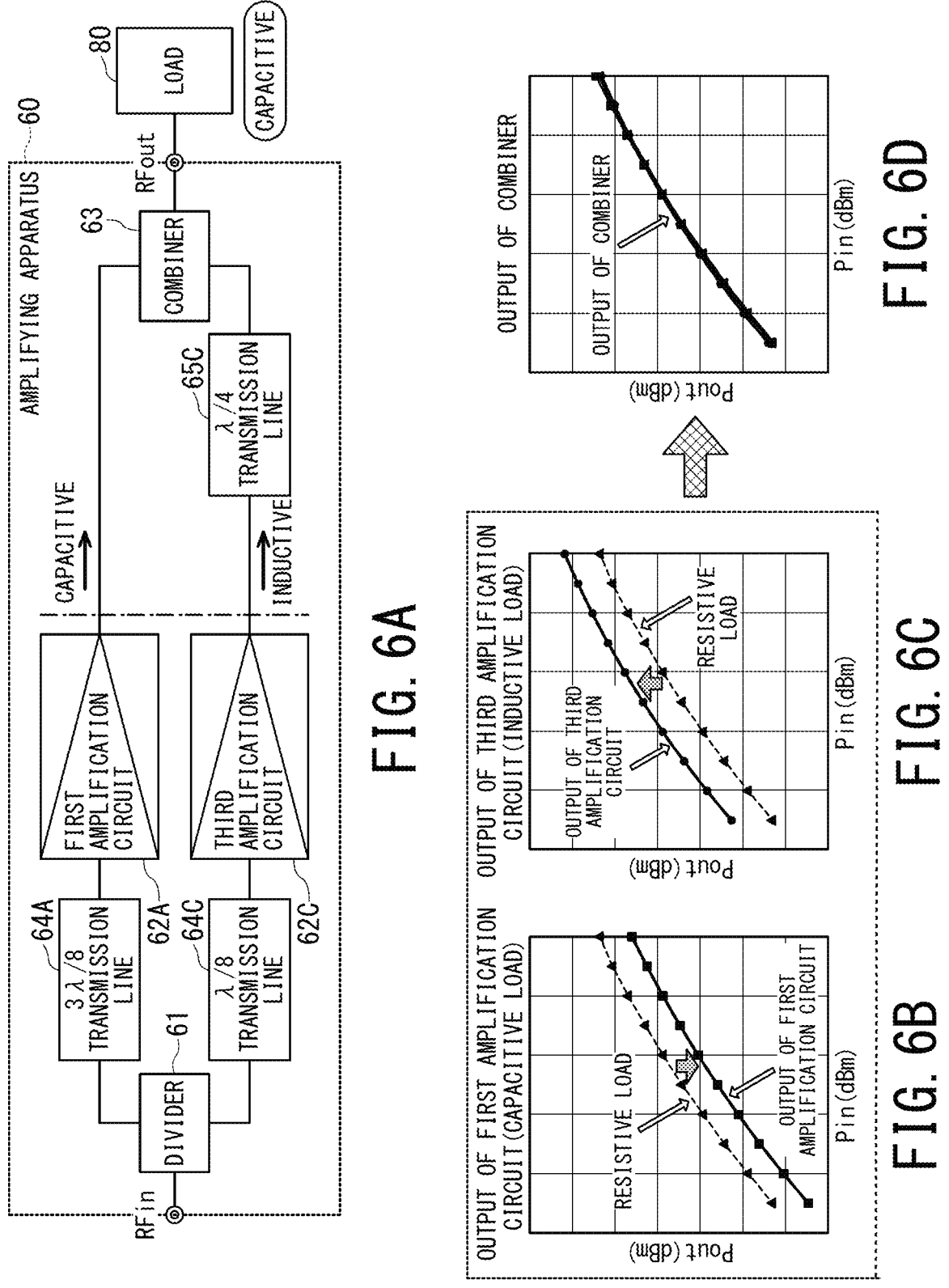

As shown in FIG. 6A, when the load 80 is capacitive, the impedance as viewed from the output terminal of the first amplification circuit 62A toward the load 80 is substantially the same as the impedance of the load 80 and is capacitive.

FIG. 6B is a schematic diagram illustrating the input/output characteristics of the first amplification circuit 62A. When the impedance as viewed from the output terminal of the first amplification circuit 62A toward the load 80 is capacitive, the gain of the first amplification circuit 62A tends to decrease as compared with the case where the load 80 is resistive.

The second λ/4 transmission line 65C is provided as an impedance conversion circuit between the output terminal of the third amplification circuit 62C and the combiner 63. Thus, when the load 80 is capacitive (i.e., when the polarity of the reactance component of the load 80 is negative), the impedance as viewed from the output terminal of the third amplification circuit 62C toward the load 80 is inductive (i.e., the polarity of the reactance component of the load 80 is positive).

More specifically, the second λ/4 transmission line 65C has a function of causing the impedance as viewed from a circuit point between the combiner 63 and the second λ/4 transmission line 65C toward the load 80 to become different from the impedance as viewed from another circuit point between the second λ/4 transmission line 65C and the third amplification circuit 62C toward the load 80. That is, providing the second λ/4 transmission line 65C between the combiner 63 and the third amplification circuit 62C can make both the polarity of the reactance component of the impedance as viewed from the output terminal of the third amplification circuit 62C toward the load 80 and the polarity of the reactance component of the impedance as viewed from the output terminal of the first amplification circuit 62A toward the load 80 opposite to each other.

In other words, the second λ/4 transmission line 65C has an effect of generating a phase difference of 180° between (a) the impedance as viewed from the output terminal of the third amplification circuit 62C toward the load 80 and (b) the impedance as viewed from the output terminal of the first amplification circuit 62A toward the load 80.

Both the first 3λ/8 transmission line 64A provided between the first amplification circuit 62A and the divider 61 and the first λ/8 transmission line 64C provided between the third amplification circuit 62C and the divider 61 function as a phase adjustment circuit for making the respective phases of the two RF signals divided by the divider 61 the same at the two input terminals of the combiner 63.

FIG. 6C is a schematic diagram illustrating the input/output characteristics of the third amplification circuit 62C. When the impedance as viewed from the output terminal of the third amplification circuit 62C toward the load 80 is inductive, the gain of the third amplification circuit 62C tends to increase as compared with the case where the load 80 is resistive.

FIG. 6D is a schematic diagram illustrating the characteristics of the combined output of the respective outputs of the first amplification circuit 62A and the third amplification circuit 62C (i.e., output of the combiner 63). In the output of the combiner 63, decrease in the gain of the first amplification circuit 62A is complemented by increase in the gain of the third amplification circuit 62C. As a result, the amplifying apparatus 60 behaves in almost the same manner as in the case of supplying power to a resistive load.

Figures 7A, 7B, 7C, 7D:
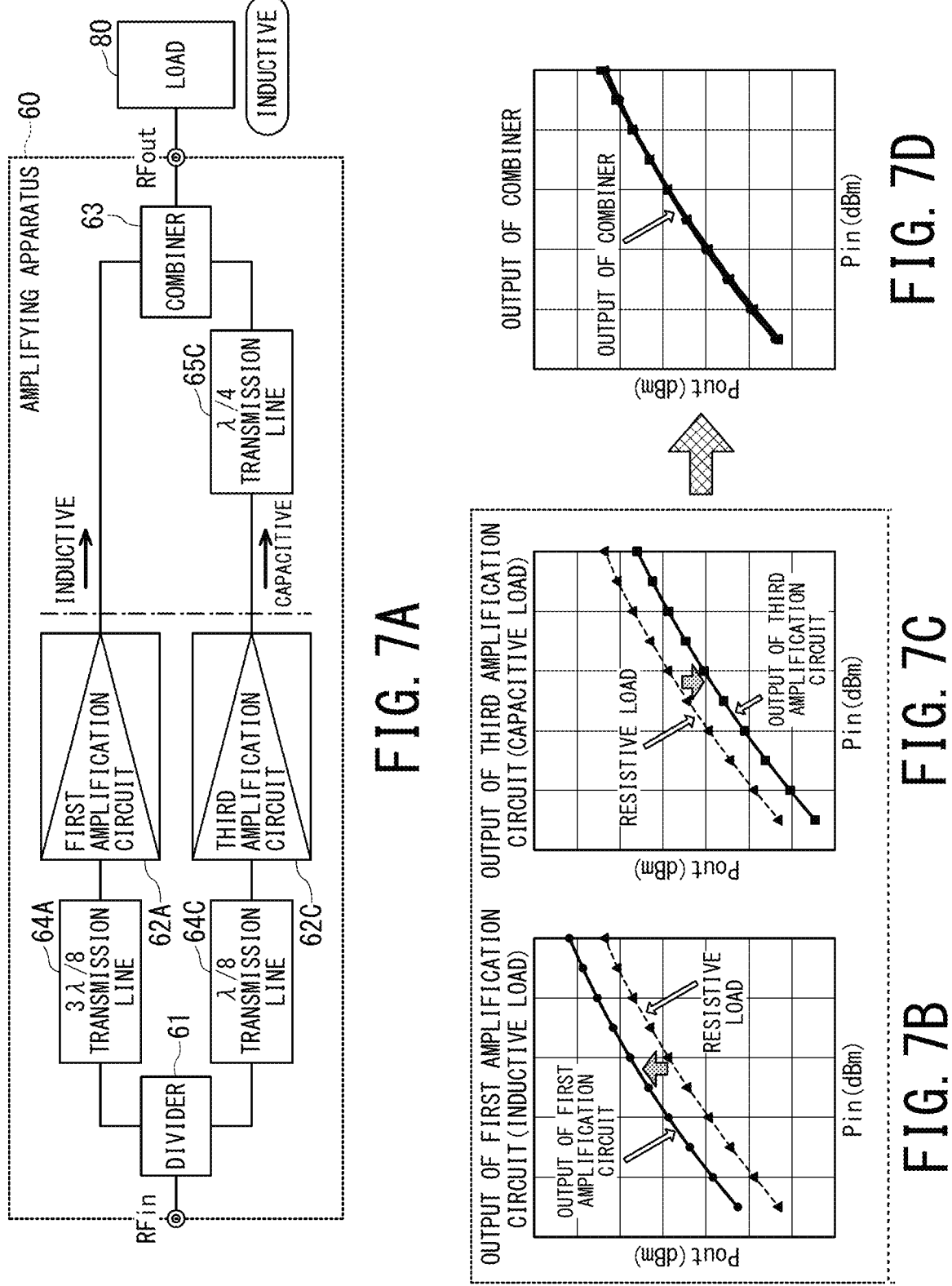

FIG. 7A to FIG. 7D are schematic diagrams illustrating the operation and effects of the amplifying apparatus 60 when the load 80 is inductive. The configuration of the amplifying apparatus 60 shown in FIG. 7A is the same as the configuration shown in FIG. 6A.

As shown in FIG. 7A, when the load 80 is inductive, the impedance as viewed from the output terminal of the first amplification circuit 62A toward the load 80 is substantially the same as the impedance of the load 80 and is inductive.

FIG. 7B is a schematic diagram illustrating the input/output characteristics of the first amplification circuit 62A. When the impedance as viewed from the output terminal of the first amplification circuit 62A toward the load 80 is inductive, the gain of the first amplification circuit 62A tends to increase as compared with the case where the load 80 is resistive, contrary to the case where the load 80 is capacitive of FIG. 6B.

The second λ/4 transmission line 65C is provided as an impedance transformation circuit between the combiner 63 and the output terminal of the third amplification circuit 62C. Thus, when the load 80 is inductive (i.e., the polarity of the reactance component of the load 80 is positive), the impedance as viewed from the output terminal of the third amplification circuit 62C toward the load 80 is capacitive (i.e., the polarity of the reactance component of the load 80 is negative).

FIG. 7C is a schematic diagram illustrating the input/output characteristics of the third amplification circuit 62C. When the impedance as viewed from the output terminal of the third amplification circuit 62C toward the load 80 is capacitive, the gain of the third amplification circuit 62C tends to decrease as compared with the case where the load 80 is resistive.

FIG. 7D is a schematic diagram illustrating the characteristics of the combined output of the respective outputs of the first amplification circuit 62A and the third amplification circuit 62C (i.e., output of the combiner 63). In the output of the combiner 63, decrease in the gain of the third amplification circuit 62C is complemented by increase in the gain of the first amplification circuit 62A. As a result, the amplifying apparatus 60 behaves in almost the same manner as in the case of supplying power to a resistive load.

In the parallel element circuit composed of the first amplification circuit 62A and the third amplification circuit 62C as described above, the second λ/4 transmission line 65C is provided as an impedance conversion circuit between the third amplification circuit 62C and the combiner 63. Hence, regardless of whether the load 80 changes into an inductive load or a capacitive load, the amplifying apparatus 60 can behave in almost the same manner as in the case where the load 80 is a resistive load, thereby the gain change of the amplifying apparatus 60 can be suppressed, and consequently, stable input/output characteristics can be provided.

The other parallel element circuit composed of the second amplification circuit 62B and the fourth amplification circuit 62D in the amplifying apparatus 60 also has the same effects as those of the parallel element circuit described by using FIG. 6A to FIG. 7D. In other words, the parallel element circuit includes an impedance conversion circuit between the load and the output terminal of at least one of two amplification circuits. The impedance conversion circuit is configured in such a manner that the polarity of the reactance as viewed from the output terminal of one of two amplification circuits toward the load is opposite to the polarity of the reactance as viewed from the output terminal of the other of two amplification circuit toward the load.

In other words, the transmission line between the combiner and the output terminal of the amplification circuit has a transmission line length corresponding to the wavelength that generates a phase difference of 180° between the impedance as viewed from the output terminal of the other of the amplification circuits toward the load 80 and the impedance as viewed from the output terminal of one of the amplification circuits toward the load 80. The amplifying apparatus 60 includes two parallel element circuits, including one pair of the first amplification circuit 62A and the third amplification circuit 62C, and the other pair of the second amplification circuit 62B and the fourth amplification circuit 62D. Thus, in each of the two parallel element circuits, the gain change of the amplifying apparatus 60 can be suppressed and stable input/output characteristics as a whole can be provided.

As shown in FIG. 3, between the first to fourth amplification circuits 62A, 62B, 62C, and 62D, the impedance as viewed from the output terminal of each amplification circuit (62A, 62B, 62C, or 62D) toward the load 80 through the impedance conversion circuit is different. In other words, the impedance as viewed from the output terminal of at least one of two amplification circuits constituting each parallel element circuit toward the load 80 via the impedance conversion circuit is different between the plurality of parallel element circuits. In the first embodiment, the number of the parallel element circuits is two. The amplifying apparatus 60 enables heat dispersion and radiation of the amplification circuits by being provided with such a plurality of parallel element circuits. Hereinbelow, on the basis of FIG. 8 and FIG. 9, a description will be given of the layout of the plurality of amplification circuits in the amplifying apparatus 60 and the effects of heat dispersion of the amplification circuits.

FIG. 8 is a graph illustrating the drain current of the amplification circuit based on the phase of the load 80. "The phase of the load 80" refers to the phase of the complex impedance or the phase of the complex reflection coefficient as viewed from the output terminal of the amplification circuit toward the load 80. FIG. 8 schematically shows the drain current of the amplification circuit when the phase of the load 80 is changed to −135°, −90°, −45°, 0°, 45°, 90°, 135°, 180° in the amplifying apparatus according to Comparative Example 1. As shown in FIG. 8, the drain current of the amplification circuit tends to be larger as the phase of the load 80 is closer to −90° which is on the most capacitive side, and the drain current of the amplification circuit tends to be smaller as the phase of the load 80 is closer to 90° which is on the most inductive side. Thus, the amplification circuit tends to generate more heat in the case when the drain current is larger on the capacitive side, and the amplification circuit tends to generate less heat when the drain current is smaller on the inductive side.

FIG. 9 illustrates the relationship between the phase of the load 80 and heat generation in the Smith chart. FIG. 9 uses shade of hatching to schematically illustrate high/low level of the heat generation temperature when the phase of the load 80 (i.e., the phase with respect to the impedance as viewed from the output terminal of each amplification circuit toward the load 80) is 0°, 45°, 90°, 135°, 180°, −135°, −90°, or −45°.

As shown in FIG. 9, the heat generation of the amplification circuit becomes larger as the phase of the load 80 becomes closer to −90° which is on the most capacitive side, and the heat generation of the amplification circuit becomes smaller as the phase of the load 80 becomes closer to 90° which is on the most inductive side. In other words, the amount of heat generation differs depending on the phase of the load 80. In each of FIG. 10A, FIG. 10B, FIG. 12, FIG. 13, FIG. 15, and FIG. 16 described below, the temperature of heat generation by the amplification circuit constituting the amplifying apparatus is schematically indicated by using the shade of hatching.

FIG. 10A and FIG. 10B illustrate the heat dispersion of the plurality of amplification circuits and their layout in the amplifying apparatus. FIG. 10A illustrates a schematic layout of the amplifying apparatus composed of two parallel element circuits, and the phase of the load 80 is −90° in one of two parallel element circuits and is 90° in the other one. FIG. 10B illustrates a schematic layout in the amplifying apparatus 60 according to the first embodiment composed of: a parallel element circuit in which the phases of the load 80 are −90° and 90°; and another parallel element circuit in which the phases of the load 80 are 0° and 180°.

In the circuit layout of FIG. 10A, the plurality of amplification circuits are disposed such that the phases of the load 80 are in the order of −90°, −90°, 90°, 90° from the top in FIG. 10A, that is, two amplifier circuits 262A in which the phase of the load 80 is −90° are biasedly disposed on one side of the amplifying apparatus 60 whereas two amplifier circuits 262B in which the phase of the load 80 is 90° are biasedly disposed on the other side of the amplifying apparatus 60. Thus, there is an imbalance in the amount of heat generated within the amplifying apparatus.

In the circuit layout of FIG. 10B, the plurality of amplification circuits are disposed such that the phases of the load 80 are in the order of −90°, 0°, 90°, 180° from the top in FIG. 10B, and thus, the heat of the amplification circuits are dispersed within the amplifying apparatus 60. In other words, in the amplifying apparatus 60 according to the first embodiment, the amplification circuits are disposed within the amplifying apparatus in such a manner that the phase with respect to the impedance is dispersed as viewed from the output terminal of each amplification circuit toward the load 80. Such a layout of the amplification circuits can reduce the imbalance in the amount of heat generation within the amplifying apparatus while maintaining stable input/output characteristics.

Modification of First Embodiment of Amplifying Apparatus

FIG. 11 is a block diagram illustrating a configuration of the amplifying apparatus 60 according to a modification of the first embodiment. The amplifying apparatus 60 according to the first embodiment is composed of two parallel element circuits. Since each of both parallel element circuits includes two amplification circuits, the amplifying apparatus 60 according to the first embodiment has a total of four amplification circuits. In the amplifying apparatus 60 according to the first embodiment, the number of amplification circuits forming each parallel element circuit is two. By contrast, the amplifying apparatus 60 according to the modification of the first embodiment is composed of n/2 parallel element circuits as shown in FIG. 11. Since each of the parallel element circuits includes two amplification circuits similarly to the first embodiment, the amplifying apparatus 60 according to the modification of the first embodiment has a total of "n" amplification circuits, wherein "n" is a positive even number. The amplifying apparatus 60 according to the modification of the first embodiment may be composed of three or more parallel element circuits, for example.

The divider 61 divides the input signal RFin outputted from the RF transmission-wave generator 35 into n input signals. The input signals divided into n channels by the divider 61 are inputted to each of the n amplification circuits.

The n input-side transmission lines 164 (164A, 164B, and 164C in the case of FIG. 11) are provided between the divider 61 and the input terminals of the n amplification circuits. The input-side transmission lines function as the phase adjustment circuits. Each of the n input-side transmission lines 164 is configured as a transmission line having a transmission line length corresponding to a (n−k)/2n wavelength for the k-th amplification circuit among the n amplification circuits, wherein "k" is a natural number from 1 to n. Regarding the (k=n)-th route, the input-side transmission line is not substantially provided or added.

In addition, n output-side transmission lines 165 (165B, 165C, and 165D in the case of FIG. 11) are provided between the combiner 63 and the output terminals of the n amplification circuits. The output-side transmission lines function as the impedance conversion circuits. Each of the n output-side transmission lines is configured as a transmission line with a transmission line length corresponding to a (k−1)/2n wavelength for the k-th amplification circuit. Regarding the k=1st route (i.e., first route), the output-side transmission line is not substantially provided or added.

The input-side transmission lines and the output-side transmission lines are configured such that the sum of the transmission line length of the input-side transmission line and the transmission line length of the output-side transmission line in each of the n amplification circuits is a length corresponding to a (n−1)/2n wavelength.

For example, in FIG. 11, the input-side transmission line 164A of λ(n−1)/2n, the input-side transmission line 164B of λ(n−2)/2n, and the input-side transmission line 164C of λ/2n are respectively provided between the divider 61 and the input terminal of the first amplification circuit 162A, the second amplification circuit 162B, or the (n−1)-th amplification circuit 162C. The output-side transmission line 165B of λ/2n, the output-side transmission line 165C of λ(n−2)/2n, and the output-side transmission line 165D of λ(n−1)/2n are respectively provided between the combiner 63 and the output terminal of the second amplification circuit 162B, the (n−1)-th amplification circuit 162C, or the n-th amplification circuit 162D. Note that λ is a wavelength.

The combiner 63 combines the output signals outputted from the n amplification circuits and supplies the combined signal to the RF coil as an RF signal. In other words, the input signal is divided into n channels by the divider 61, amplified by n amplification circuits, and then combined.

In the amplifying apparatus 60, n phase adjustment circuits are provided between the divider 61 and the respective input terminals of the n amplification circuits, and n impedance conversion circuits are provided between the combiner 63 and the respective output terminals of the n amplification circuits. Each of the n phase adjustment circuits adjusts the phase of the k-th amplification circuit among the n amplification circuits to a phase corresponding to a (n−k)/2n wavelength. Each of the n impedance conversion circuits adjusts the phase of the k-th amplification circuit to a phase corresponding to a (k−1)/2n wavelength. Further, the phase adjustment circuits and the impedance conversion circuits are configured in such a manner that, in each of the n amplification circuits, the sum of the phase of the phase adjustment circuit and the phase of the impedance conversion circuit corresponds to a (n−1)/2n wavelength.

Hereafter, a description will be given of the effects of heat dispersion in the amplification circuits of the modification of the first embodiment. FIG. 12 is a schematic diagram illustrating a first layout of the plurality of amplification circuits in the amplifying apparatus 60 according to the modification of the first embodiment. The amplifying apparatus 60 in FIG. 12 is composed of: amplification circuits 362A to 362H in the case of n=8 as an aspect of the plurality of amplification circuits; input-side transmission lines 364A to 364G; and output-side transmission lines 365B to 365H. FIG. 12 illustrates the layout of the amplifying apparatus 60 including four parallel element circuits composed of: a first parallel element circuit in which the phases of the load 80 are −90° and 90°; a second parallel element circuit in which the phases of the load 80 are 0° and 180°; a third parallel element circuit in which the phases of the load 80 are −45° and 135°; and a fourth parallel element circuit in which the phases of the load 80 are 45° and −135°.

In the circuit layout of FIG. 12, inside the amplifying apparatus, the eight amplification circuits 362A to 362H in which the phases of the load 80 are respectively −90°, −45°, 0°, 45°, 90°, 135°, 180°, and −135° are connected in parallel next to each other in order. In this circuit layout, for example, the amplification circuits 362A and 362B are disposed to be adjacent to each other, and the amplification circuit 362B and 362C are disposed to be adjacent to each other.

In other words, the respective n amplification circuits corresponding to n different phases obtained by dividing the phase range from −180° to +180° into n at equal intervals are arranged in phase order. The imbalance in the heat amount to be generated within the amplifying apparatus can be alleviated by appropriately arranging the n amplification circuits on the basis of the relationship between heat generation amount and the phase for the impedance as viewed from the output terminal of each amplification circuit toward the load 80 as shown in the Smith chart in FIG. 9. That is, the heat of the n amplification circuits can be dispersed within the amplifying apparatus.

FIG. 13 illustrates another circuit layout different from the amplifying apparatus 60 in FIG. 12. In the circuit layout of FIG. 13, in the amplifying apparatus, eight amplification circuits 362A to 362H in which the phases of the load 80 are respectively 90°, −45°, 0°, 45°, −90°, 135°, 180°, and −135° are arranged in parallel next to each other. In this circuit layout, for example, the amplification circuits 362E and 362B are disposed next to each other, and the amplification circuits 362B and 362C are disposed next to each other. In this manner, the respective n amplification circuits corresponding to n different phases obtained by dividing the phase range from −180° to +180° into n at equal intervals may not need to be arranged in phase order. For example, in the amplifying apparatus 60, the n amplification circuits may be arranged in such a manner that the polarity of the reactance as viewed from the output terminal of each amplification circuit toward the load 80 is opposite to or different from that of the adjacent amplification circuit.

For example, the amplifying apparatus 60 may be configured such that two amplification circuits constituting each of the parallel element circuits are not adjacent to each other. For example, for each of four pairs including: a first parallel element circuit in which the phases of the load 80 are −90° and 90°, a second parallel element circuit in which the phases of the load 80 are 0° and 180°, a third parallel element circuit in which the phases of the load 80 are −45° and 135°, and a fourth parallel element circuit in which the phases of the load 80 are 45° and −135°, two amplification circuits constituting each of these four parallel element circuits may be arranged to be not adjacent to each other.

The amplifying apparatus 60 according to the modification of the first embodiment can increase the output power of the amplifying apparatus 60 while maintaining the effects of the first embodiment.

Second Embodiment of Amplifying Apparatus

FIG. 14 is a block diagram illustrating a configuration of the amplifying apparatus 60 according to the second embodiment. The amplifying apparatus 60 according to the second embodiment has n amplification circuits by being provided with n/2 parallel element circuits, similarly to the amplifying apparatus 60 according to the modification of the first embodiment. Different from the configuration of the modification of the first embodiment, the amplifying apparatus 60 according to the second embodiment is configured such that the impedance as viewed from the output terminals of two amplification circuits constituting each parallel element circuit toward the load 80 through the impedance conversion circuit is not different between the plurality of parallel element circuits.

For example, as shown in FIG. 14, the amplifying apparatus 60 according to the second embodiment includes: the divider 61, n/2 first $\lambda/4$ transmission lines 264, first to (n/2)-th amplification circuits 262A, (n/2+1)-th to n-th amplification circuits 262B, n/2 second $\lambda/4$ transmission lines 265, and the combiner 63. The first $\lambda/4$ transmission lines 264 are quarter-wavelength input-side transmission lines. In addition, the second $\lambda/4$ transmission lines 265 are quarter-wavelength transmission lines.

The divider 61 divides the input signal RFin outputted from the RF transmission-wave generator 35 into n input signals. The input signal divided into n channels by the divider 61 are inputted to each of the n amplification circuits.

The first $\lambda/4$ input-side transmission lines 264 are provided between the divider 61 and the respective input terminals of n/2 amplification circuits 262A represented by the first to (n/2)-th amplification circuits 262A. The input-side transmission lines function as the phase adjustment circuits. In addition, the second $\lambda/4$ output-side transmission lines 265 are provided between the combiner 63 and the respective output terminals of n/2 amplification circuits 262B represented by (n/2+1)-th to n-th amplification circuits 262B. The output-side transmission lines function as the impedance conversion circuits. The first $\lambda/4$ input-side transmission lines 264 and the second $\lambda/4$ output-side transmission lines 265 are provided in order to suppress the influence of the load change, and are characteristic configuration of the amplifying apparatus 60 of the present embodiment.

Each parallel element circuit in this case is a combination of one amplification circuit 262A with one input-side transmission line 264 and one amplification circuit 262B with one output-side transmission line 265. In other words, of the two amplification circuits constituting each parallel element circuit, the impedance conversion circuit is provided between the load 80 and the output terminal of one amplification circuit. Due to the presence of this impedance conversion circuit, the amplifying apparatus 60 is configured such that the polarity of the reactance as viewed from the output terminal of one of two amplification circuits toward the load 80 is opposite to the polarity of the reactance as viewed 80 from the output terminal of the other of two amplification circuits toward the load 80.

The combiner 63 combines the output signals outputted from the n amplification circuits, and supplies the combined signal to the RF coil as an RF signal. In other words, the input signal is divided into n channels by the divider 61, amplified by the n amplification circuits, and then combined.

This configuration can suppress the gain change of the amplifying apparatus 60 in each of the plurality of parallel element circuits, and thus, can provide stable input/output characteristics as a whole. In addition, the output power of the amplifying apparatus 60 can be increased. Hereinbelow, by referring to FIG. 15 and FIG. 16, a description will be given of the difference in heat dispersion depending on the layout of the amplification circuits inside the amplifying apparatus provided with the plurality of amplification circuits.

FIG. 15 illustrates the heat dispersion of the plurality of amplification circuits and their layout within the amplifying apparatus. In the case of FIG. 15 illustrating the amplifying apparatus composed of four parallel element circuits, the plurality of amplification circuits are disposed such that the phases of the load 80 are in the order of −90°, −90°, −90°, −90°, 90°, 90°, 90°, 90° from the top side in FIG. 15. That is, four amplification circuits 262A in which the phase of the load 80 is −90° are disposed on one side of the amplifying apparatus 60 whereas the four amplification circuits 262B in which the phase of the load 80 is 90° are disposed on the other side of the amplifying apparatus 60. In this manner, when the phase of the load 80 is biased toward the capacitive side or the inductive side depending on the position in the amplifying apparatus, bias in the amount of heat generation within the amplifying apparatus occurs. In particular, on the capacitive side where heat generation is large (for example, within the broken-line frame S in FIG. 15), it becomes difficult for the amplification circuits to diffuse the heat.

FIG. 16 illustrates an amplifying apparatus composed of four parallel element circuits similarly to FIG. 15. In FIG. 16, four amplification circuits 262A in which the phase of the load 80 is −90° and four amplification circuits 262B in which the phase of the load 80 is 90° are arranged alternately such that the amplification circuit 262A and the amplification circuit 262A are adjacent to each other. Among the plurality of amplification circuits 262A and 262B, the amplification circuits 262A on the capacitive side with larger heat generation amount and the amplification circuits 262B on the inductive side with smaller heat generation amount are arranged alternately within the amplifying apparatus, and thereby, the amplifying apparatus 60 according to the second embodiment can reduce the imbalance in the amount of heat generation inside it.

Third Embodiment of Amplifying Apparatus

FIG. 17 is a block diagram illustrating a configuration of the amplifying apparatus 60 according to the third embodiment. The amplifying apparatus 60 according to the third embodiment includes at least n variable phase shifters and a phase control circuit in addition to the configuration according to the modification of the first embodiment, wherein "n" is a positive even number. Although only four amplification circuits out of the n amplification circuits are illustrated in FIG. 17, the number of the amplification circuits are not limited to a specific number. The amplifying apparatus 60 according to the third embodiment includes the divider 66, the n variable phase shifters (67A, 67B, 67C, 67D in the case of FIG. 17), the phase control circuit 69, and n couplers (68A, 68B, 68C, 68D in the case of FIG. 17), in addition to the configuration according to the modification of the first embodiment.

The first to n-th variable phase shifters 67 are provided between the divider 61 and the first to n-th input-side transmission lines (164A, 164B, 164C in the case of FIG. 17). The first to n-th variable phase shifters adjust the phases of the RF signals on the respective routes from the divider 61 to the combiner 63 via the first to n-th amplification circuits (162A, 162B, 162C, 162D in the case of FIG. 17).

The phase control circuit 69 performs feedback control on each variable phase shifter 67 such that a first phase at a first input terminal of the combiner 63 that receives a first output signal from one of the n amplification circuits becomes the same phase as the respective phases of the other input terminals of the combiner 63 that receives the respective output signals from all the other (n−1) amplification circuits.

In other words, the phase control circuit 69 has a built-in phase detectors and makes the respective phases of n RF signals to be inputted to the combiner 63 the same or phase-coherent by controlling the phase shift amount of each of the first to n-th variable phase shifters 67 in such a manner that the phases to be detected by the respective phase detectors become the same with respect to every amplification circuit.

Under such phase control, even if the passing phase of each of the first to n-th amplification circuits changes due to thermal factors, the respective phases of n RF signals to be inputted to the combiner 63 can be made the same, and the combined output can be maintained at its maximum value.

Fourth Embodiment of Amplifying Apparatus

In the first to third embodiments and the modification of the first embodiment, each of the input-side transmission lines and the output-side transmission lines is composed of a transmission line having a length corresponding to a predetermined wavelength. In the fourth embodiment, the input-side transmission lines 64, 164, 264, and the output-side transmission lines 65, 165, 265 are replaced by π-type (C-L-C) LC circuits, each of which includes a capacitor C and an inductor L as shown in FIG. 18A.

Each LC circuit may also be a π-type (L-C-L) LC circuit in which a capacitor C is provided between two inductors L, as shown in FIG. 18B.

In addition, each LC circuit may be a T-type (L-C-L) LC circuit as shown in FIG. 18C or may be a T-type (C-L-C) LC circuit as shown in FIG. 18D. These LC circuits also enable a phase shift corresponding to a predetermined wavelength, and can achieve the same effects available by the input-side transmission lines and output-side transmission lines being respectively composed of a transmission line with a length corresponding to a predetermined wavelength. The LC circuit corresponding to the input-side transmission line(s) is one aspect of the phase adjustment circuit, and the LC circuit corresponding to the output-side transmission line(s) is one aspect of the impedance conversion circuit.

As described above, the MRI apparatus of each embodiment can suppress the influence of the load change without providing a high-power isolator between the RF amplifier and the RF coil in the MRI apparatus.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the scope of the inventions as defined by the appended claims.

What is claimed is:

1. An MRI apparatus comprising:
an RF coil configured to apply an RF (Radio Frequency) signal of a Larmor frequency to an object; and
an amplifying apparatus configured to amplify the RF signal and supply the amplified RF signal to a load that includes at least the RF coil and the object, wherein:
the amplifying apparatus comprises a plurality of parallel element circuits, each of which includes two amplification circuits installed in parallel and an impedance conversion circuit provided between the load and an output terminal of at least one of the two amplification circuits;

the impedance conversion circuit is configured in such a manner that, in each of the plurality of parallel element circuits, a polarity of reactance as viewed from an output terminal of one of the two amplification circuits toward the load is opposite to a polarity of reactance as viewed from an output terminal of another of the two amplification circuits toward the load; and the impedance conversion circuit is further configured in such a manner that impedance as viewed from the output terminal of at least one of the two amplification circuits toward the load via the impedance conversion circuit is different between the plurality of parallel element circuits.

2. The MRI apparatus according to claim 1, wherein:

the amplifying apparatus includes a total of n amplification circuits (n is a positive even number) by being provided with n/2 parallel element circuits as the plurality of parallel element circuits;

the amplifying apparatus further comprises a divider configured to divide an input signal to be inputted to the amplifying apparatus into n input signals for respective amplification circuits, n phase adjustment circuits provided between the divider and respective input terminals of the n amplification circuits, a combiner configured to combine respective output signals outputted from the n amplification circuits and supply a combined signal to the RF coil as the RF signal, and n impedance conversion circuits provided between the combiner and respective output terminals of the n amplification circuits;

each of the n phase adjustment circuits is configured to adjust a phase of a k-th amplification circuit (k is a natural number from 1 to n) of the n amplification circuits to a phase corresponding to a (n–k)/2n wavelength;

each of the n impedance conversion circuits is configured to adjust a phase of the k-th amplification circuit to a phase corresponding to a (k–1)/2n wavelength; and the n phase adjustment circuits and the n impedance conversion circuits are configured in such a manner that a sum of a phase of a phase adjustment circuit and a phase of a impedance conversion circuit in each of the n amplification circuits corresponds to a (n–1)/2n wavelength.

3. The MRI apparatus according to claim 2, wherein each phase adjustment circuit and each impedance conversion circuit are configured to adjust a phase based on a transmission line length.

4. The MRI apparatus according to claim 2, wherein each phase adjustment circuit and each impedance conversion circuit are configured to adjust a phase by using an LC circuit composed of a capacitor C and an inductor L.

5. The MRI apparatus according to claim 2, wherein, in each of the plurality of parallel element circuits, a transmission line between an output terminal of the amplification circuits and the combiner has a wavelength that generates a phase difference of 180° between impedance as viewed from the output terminal of the another of the two amplification circuits toward the load and impedance as viewed from the output terminal of the one of the two amplification circuit toward the load.

6. The MRI apparatus according to claim 2, wherein the n amplification circuits are disposed in the amplifying apparatus in such a manner that heat of the n amplification circuits is dispersed based on relationship between heat generation amount and a phase with respect to impedance as viewed from the output terminal of each of the amplification circuits toward the load.

7. The MRI apparatus according to claim 2, wherein, in each of the plurality of parallel element circuits, the two amplification circuits are disposed to be not adjacent to each other within the amplifying apparatus.

8. The MRI apparatus according to claim 2, wherein the n amplification circuits are disposed within the amplifying apparatus in such a manner that a polarity of reactance as viewed from an output terminal of each of the amplification circuits toward the load is opposite to a polarity of reactance as viewed from an output terminal of an adjacent amplification circuit toward the load.

9. The MRI apparatus according to claim 2, further comprising:

n variable phase shifters provided between the divider and the n amplification circuits; and a phase control circuit configured to perform feedback control on the n variable phase shifters in such a manner that a first phase at an input terminal of the combiner that receives an output signal from one of the n amplification circuits becomes a same phase as a second phase of another input terminal of the combiner that receives an output signal from another of the n amplification circuits.

10. An MRI apparatus comprising:

an RF coil configured to apply an RF signal of a Larmor frequency to an object; and an amplifying apparatus configured to amplify the RF signal and supply the amplified RF signal to a load that includes at least the RF coil and the object, wherein:

the amplifying apparatus comprises a plurality of parallel element circuits, each of which includes two amplification circuits installed in parallel and an impedance conversion circuit provided between the load and an output terminal of one of the two amplification circuits;

the impedance conversion circuit is configured in such a manner that, in each of the plurality of parallel element circuits, a polarity of reactance as viewed from an output terminal of one of the two amplification circuits toward the load is opposite to a polarity of reactance as viewed from an output terminal of another of the two amplification circuits toward the load; and the plurality of parallel element circuits are disposed in such a manner that the one of the two amplification circuits and the another of the two amplification circuits are alternately arranged.

11. An amplifying apparatus configured to amplify an RF signal of a Larmor frequency to be applied to an object and supply the amplified RF signal to a load that includes at least an RF coil and the object, wherein:

the amplifying apparatus comprises a plurality of parallel element circuits, each of which includes two amplification circuits installed in parallel and an impedance conversion circuit provided between the load and an output terminal of at least one of the two amplification circuits;

the impedance conversion circuit is configured in such a manner that, in each of the plurality of parallel element circuits, a polarity of reactance as viewed from an output terminal of one of the two amplification circuits toward the load is opposite to a polarity of reactance as viewed from an output terminal of another of the two amplification circuits toward the load; and the impedance conversion circuit is further configured in such a manner that impedance as viewed from the output terminal of an amplification circuit toward the load via the impedance conversion circuit is different between the plurality of parallel element circuits.

* * * * *